United States Patent
Lien et al.

(10) Patent No.: US 11,270,776 B1
(45) Date of Patent: Mar. 8, 2022

(54) COUNTERMEASURE FOR REDUCING PEAK CURRENT DURING PROGRAM OPERATION UNDER FIRST READ CONDITION

(71) Applicant: SanDisk Technologies LLC, Addison, TX (US)

(72) Inventors: Yu-Chung Lien, San Jose, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/116,836

(22) Filed: Dec. 9, 2020

(51) Int. Cl.
*G11C 16/04* (2006.01)
*G11C 16/30* (2006.01)
*G11C 16/16* (2006.01)
*G11C 16/26* (2006.01)
*G11C 16/34* (2006.01)
*G11C 16/24* (2006.01)
*G11C 16/08* (2006.01)

(52) U.S. Cl.
CPC .......... *G11C 16/30* (2013.01); *G11C 16/0483* (2013.01); *G11C 16/08* (2013.01); *G11C 16/16* (2013.01); *G11C 16/24* (2013.01); *G11C 16/26* (2013.01); *G11C 16/3459* (2013.01); *G11C 16/3454* (2013.01)

(58) Field of Classification Search
CPC .......................... G11C 16/0483; G11C 16/3454
USPC .......................................... 365/185.17, 185.22
See application file for complete search history.

(56) References Cited

U.S. PATENT DOCUMENTS

| | | | |
|---|---|---|---|
| 9,286,987 B1 * | 3/2016 | Dong | G11C 16/0483 |
| 9,543,020 B2 | 1/2017 | Suzuki | |
| 10,026,486 B1 | 7/2018 | Dutta et al. | |
| 10,229,744 B2 | 3/2019 | Dutta et al. | |
| 10,283,202 B1 | 5/2019 | Chen et al. | |
| 10,559,365 B2 | 2/2020 | Yang et al. | |
| 10,636,500 B1 | 4/2020 | Chen et al. | |
| 10,762,973 B1 | 9/2020 | Lu et al. | |
| 10,770,157 B1 | 9/2020 | Chen et al. | |
| 10,861,537 B1 | 12/2020 | Lien et al. | |
| 2019/0304549 A1 | 10/2019 | Yang et al. | |
| 2020/0152282 A1 | 5/2020 | Yang et al. | |

OTHER PUBLICATIONS

U.S. Appl. No. 16/790,306, filed Feb. 13, 2020.
U.S. Appl. No. 16/778,821, filed Jan. 31, 2020.

(Continued)

*Primary Examiner* — Jason Lappas
(74) *Attorney, Agent, or Firm* — Vierra Magen Marcus LLP

(57) ABSTRACT

Apparatuses and techniques are described for reducing a peak current consumption during a program operation for a memory device. A higher current peak occurs in a first program loop of the program operation when a set of word lines is in a discharged state, also referred to as a first read condition. A current reduction countermeasure can be used when ramping up voltages of unselected word lines to a read pass voltage during the verify phase of the program loop. The countermeasure can involve reducing the ramp up rate, reducing the read pass voltage, or delaying the start of the ramp up for a portion of the word lines.

20 Claims, 23 Drawing Sheets

(56) References Cited

OTHER PUBLICATIONS

U.S. Appl. No. 16/668,886, filed Oct. 30, 2019.
U.S. Appl. No. 16/912,381, filed Jun. 25, 2020.
International Search Report & The Written Opinion of the International Searching Authority dated Sep. 14, 2021, International Application No. PCT/US2021/033818.

* cited by examiner

Fig. 1A
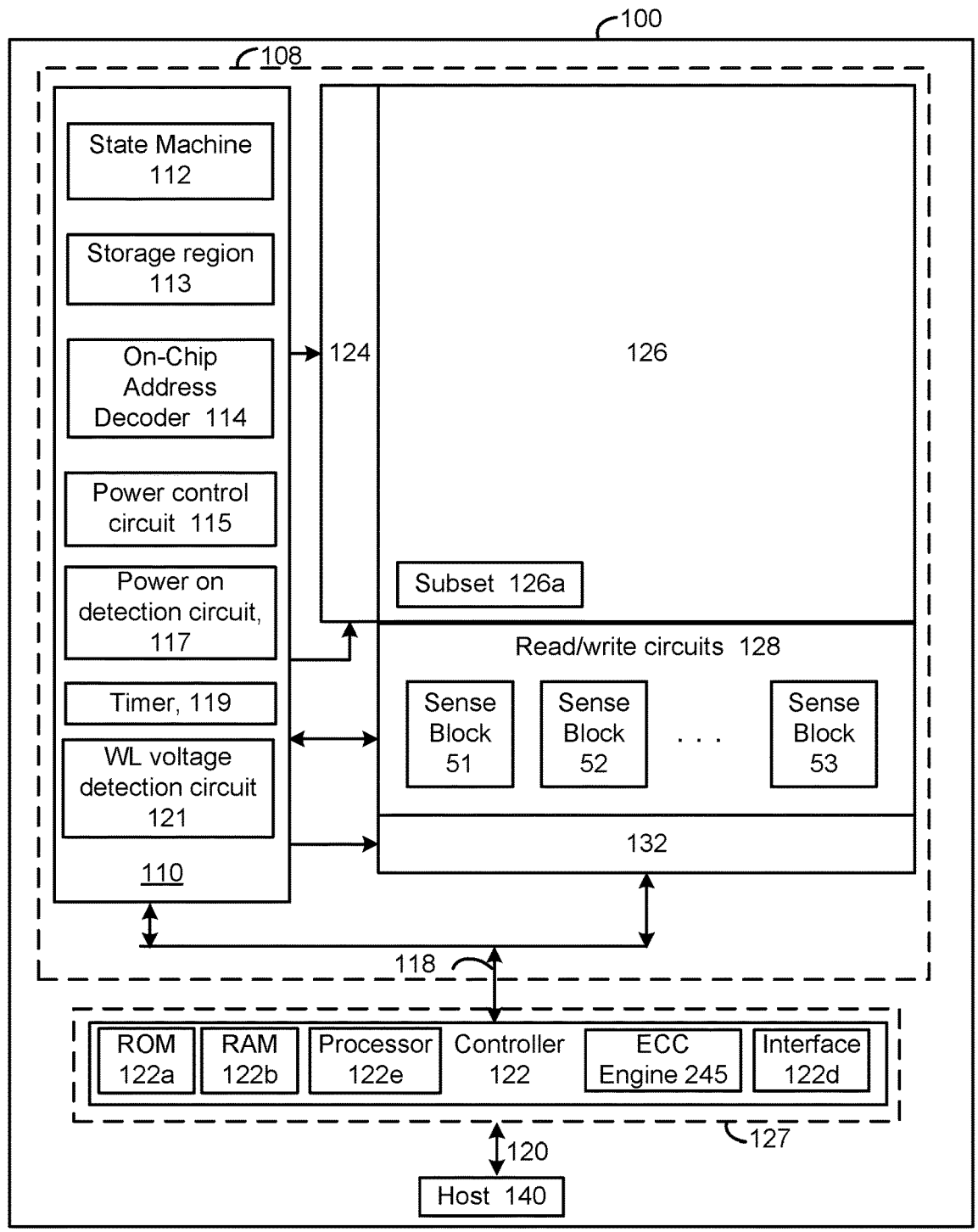
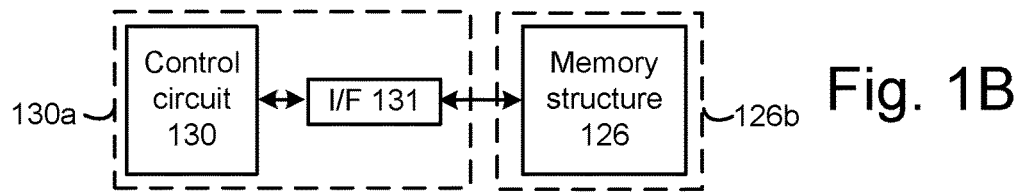
Fig. 1B

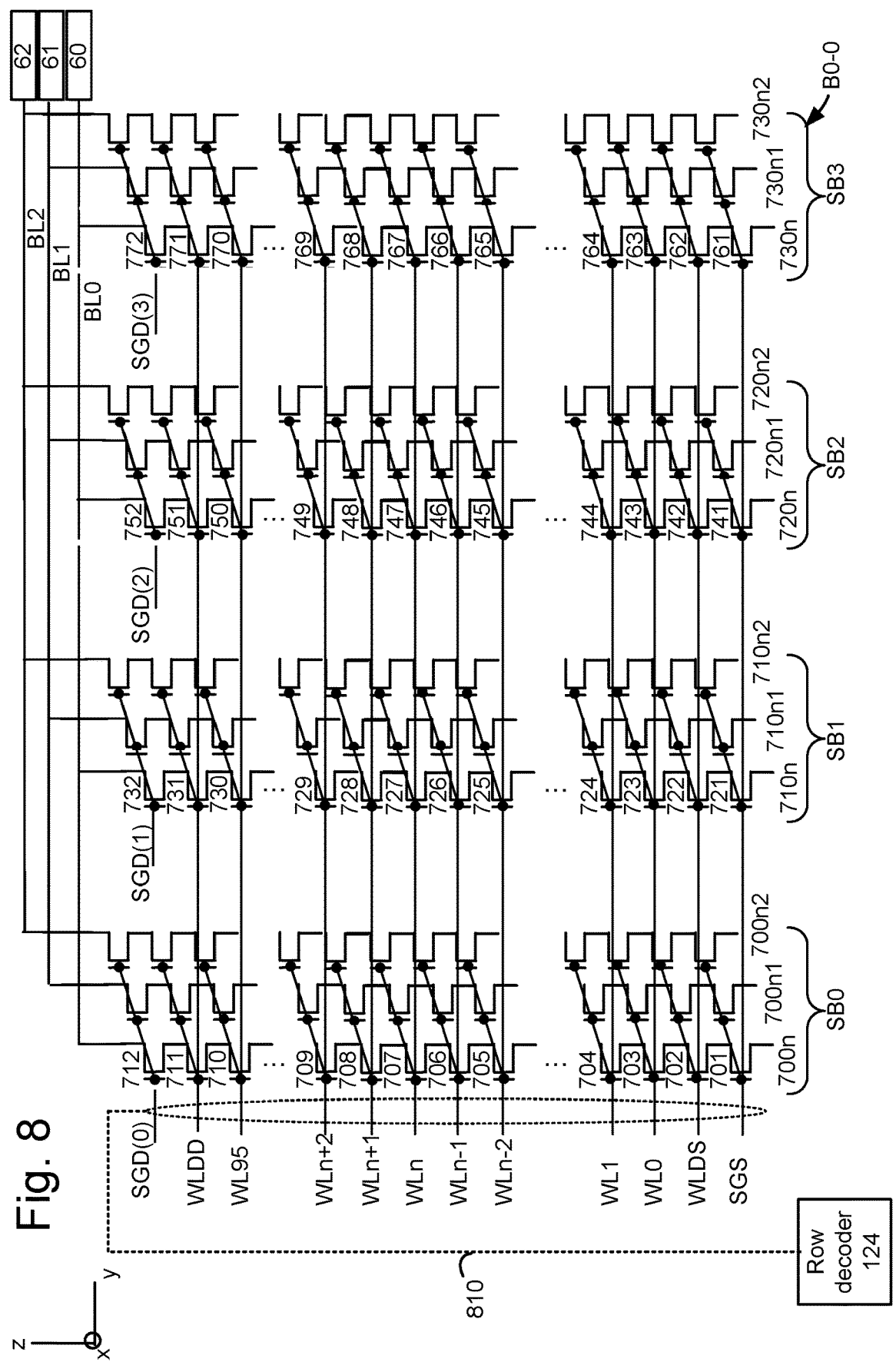

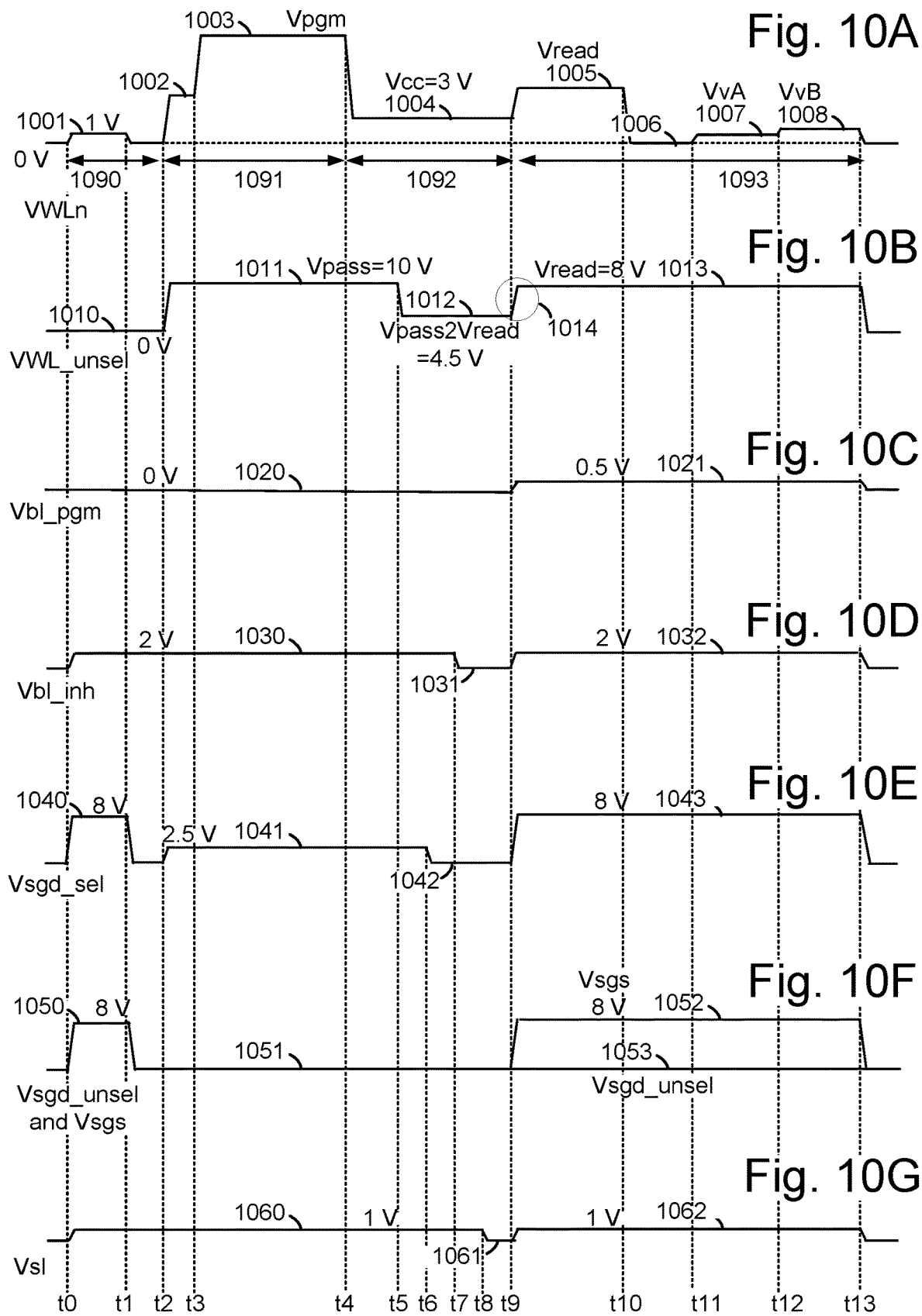

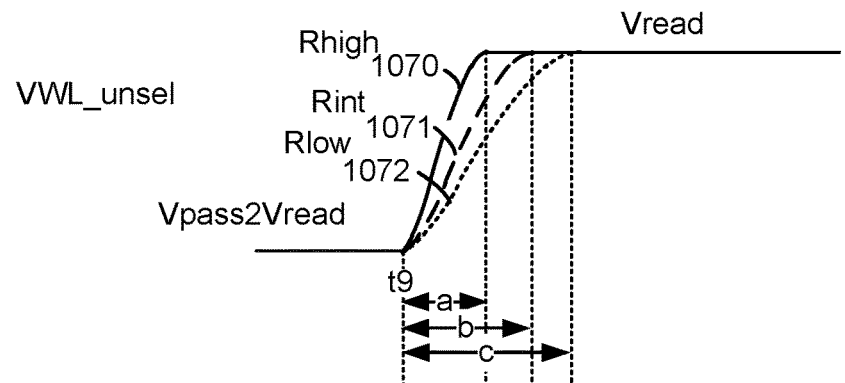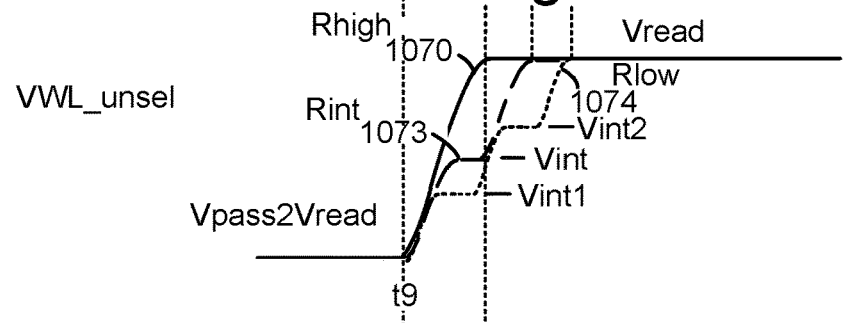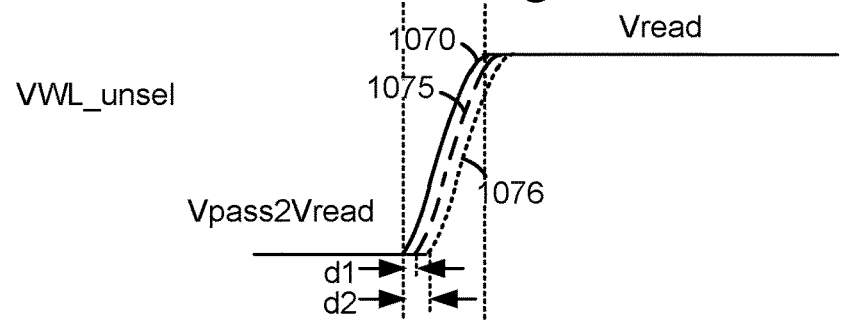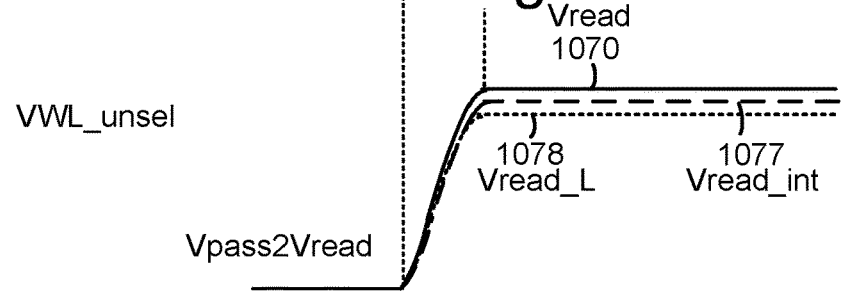

Fig. 10J1
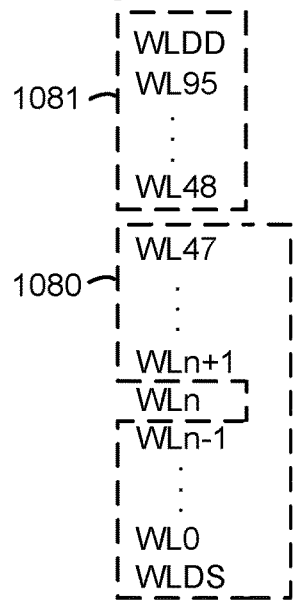
Fig. 10J2
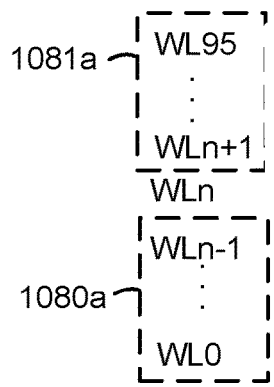
Fig. 10J3
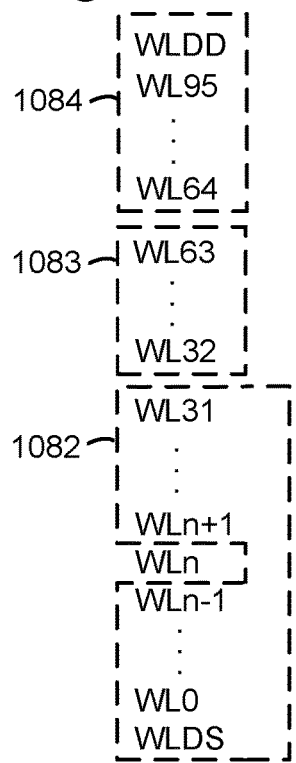
Fig. 10L
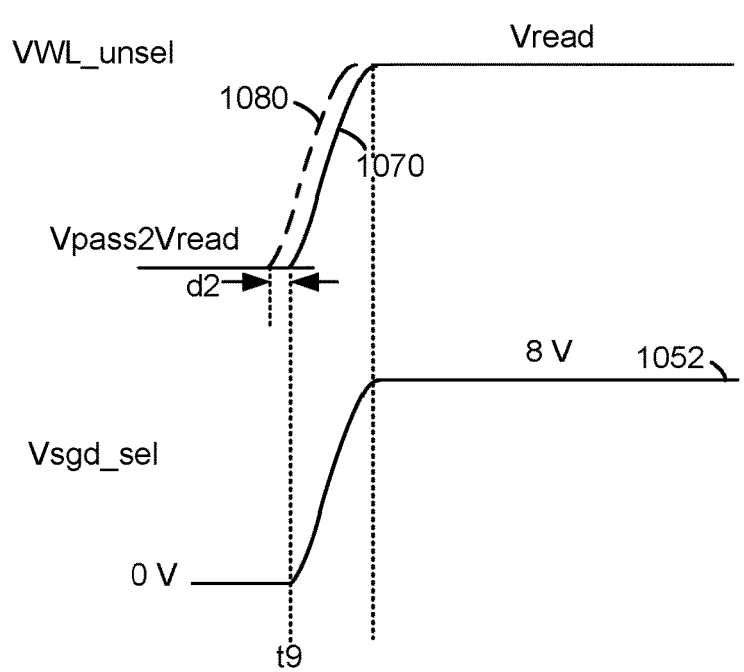

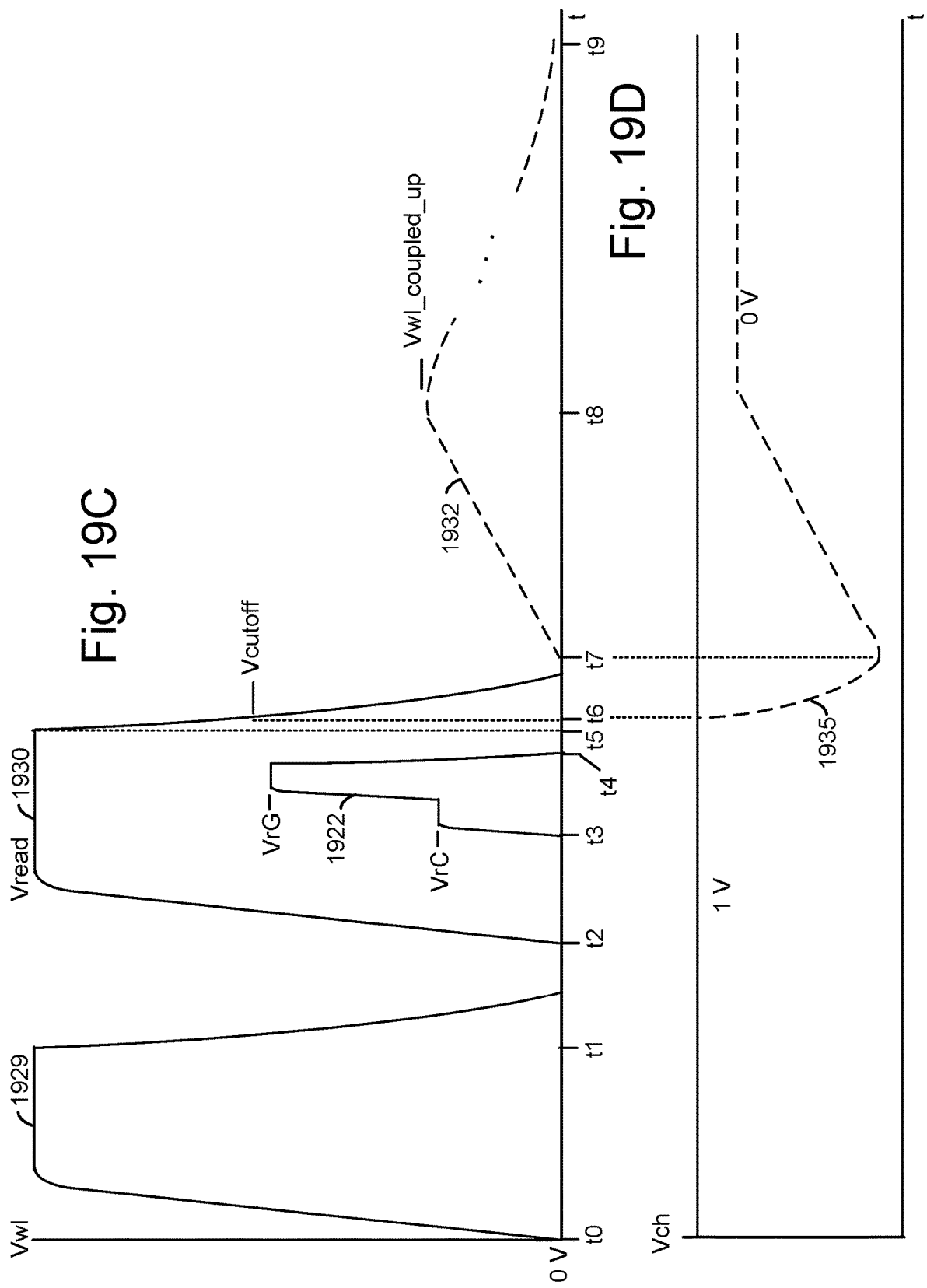

COUNTERMEASURE FOR REDUCING PEAK CURRENT DURING PROGRAM OPERATION UNDER FIRST READ CONDITION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 8 depicts an example view of the block B0-0 of FIG. 4, with respective NAND strings arranged in sub-blocks, along with associated bit lines and sense circuits.

FIG. 10A depicts voltages applied to a selected word line, WLn in a first program loop of a program operation, consistent with FIG. 9B.

FIG. 10B depicts a voltage, VWL_unsel, applied to unselected word lines, consistent with FIG. 10A.

FIG. 10C depicts a voltage, Vbl_pgm, applied to bit lines of programmed NAND strings, consistent with FIG. 10A.

FIG. 10D depicts a voltage, Vbl_inh, applied to bit lines of inhibited NAND strings, consistent with FIG. 10A.

FIG. 10E depicts a voltage, Vsgd_sel, applied to SGD transistors of a selected sub-block, consistent with FIG. 10A.

FIG. 10F depicts voltages applied to SGD transistors of unselected sub-blocks and to SGS transistors, consistent with FIG. 10A.

FIG. 10G depicts a voltage applied to a source line, consistent with FIG. 10A.

FIG. 10H depicts example voltage signals consistent with the region 1014 of FIG. 10B, where there is a continuous increase in the voltage signals (plots 1070-1072), and example rates of increase are Rhigh, Rint and Rlow, respectively.

FIG. 10I depicts example voltage signals consistent with the region 1014 of FIG. 10B, where there is a continuous increase in the voltage signal (plot 1070), a stepped increase in the voltage signals (plot 1073 and 1074), and example rates of increase are Rhigh, Rint and Rlow, respectively.

FIG. 10J depicts example voltage signals consistent with the region 1014 of FIG. 10B, where a start of an increase in the voltage signals (plots 1075 and 1076) is delayed relative to a start of an increase in the voltage signal (plot 1075) by d1 and d2, respectively.

FIG. 10J1 depicts two example groups of unselected word lines, groups 1080 and 1081, consistent with FIG. 10J.

FIG. 10J2 depicts programmed and unprogrammed groups of unselected word lines, groups 1080a and 1081a, consistent with FIG. 10J.

FIG. 10J3 depicts three example groups of unselected word lines, groups 1082-1084, consistent with FIG. 10J.

FIG. 10K depicts example voltage signals consistent with the region 1014 of FIG. 10B, where the voltage signals of plots 1070, 1077 and 1078 have magnitudes of Vread, Vread_int and Vread_L, respectively.

FIG. 10L depicts example voltage signals consistent with the region 1014 of FIG. 10B, where a start of an increase in the voltage signal (plot 1080) for a group of word lines occurs before a start of the increase of Vsgd_sel (plot 1052).

FIG. 14A shows how a first or second read condition is a function of a time since a last sensing operation, in an example implementation of FIG. 13A, step 1302a.

FIG. 16A shows how a ramp rate for unselected word lines, consistent with FIGS. 10H and 10I, is a function of a first or second read condition, in an example implementation of FIG. 13B, step 1313a.

FIG. 16B shows how a ramp rate for unselected word lines, consistent with FIGS. 10H and 10I, is a function of a first, intermediate or second read condition, in an example implementation of FIG. 13B, step 1313a.

FIG. 19C depicts a plot of example voltage signals in a read operation which provide coupling up of word line voltages.

FIG. 19D depicts a plot of a channel voltage (Vch) corresponding to FIG. 19C.

DETAILED DESCRIPTION

Figure 2:
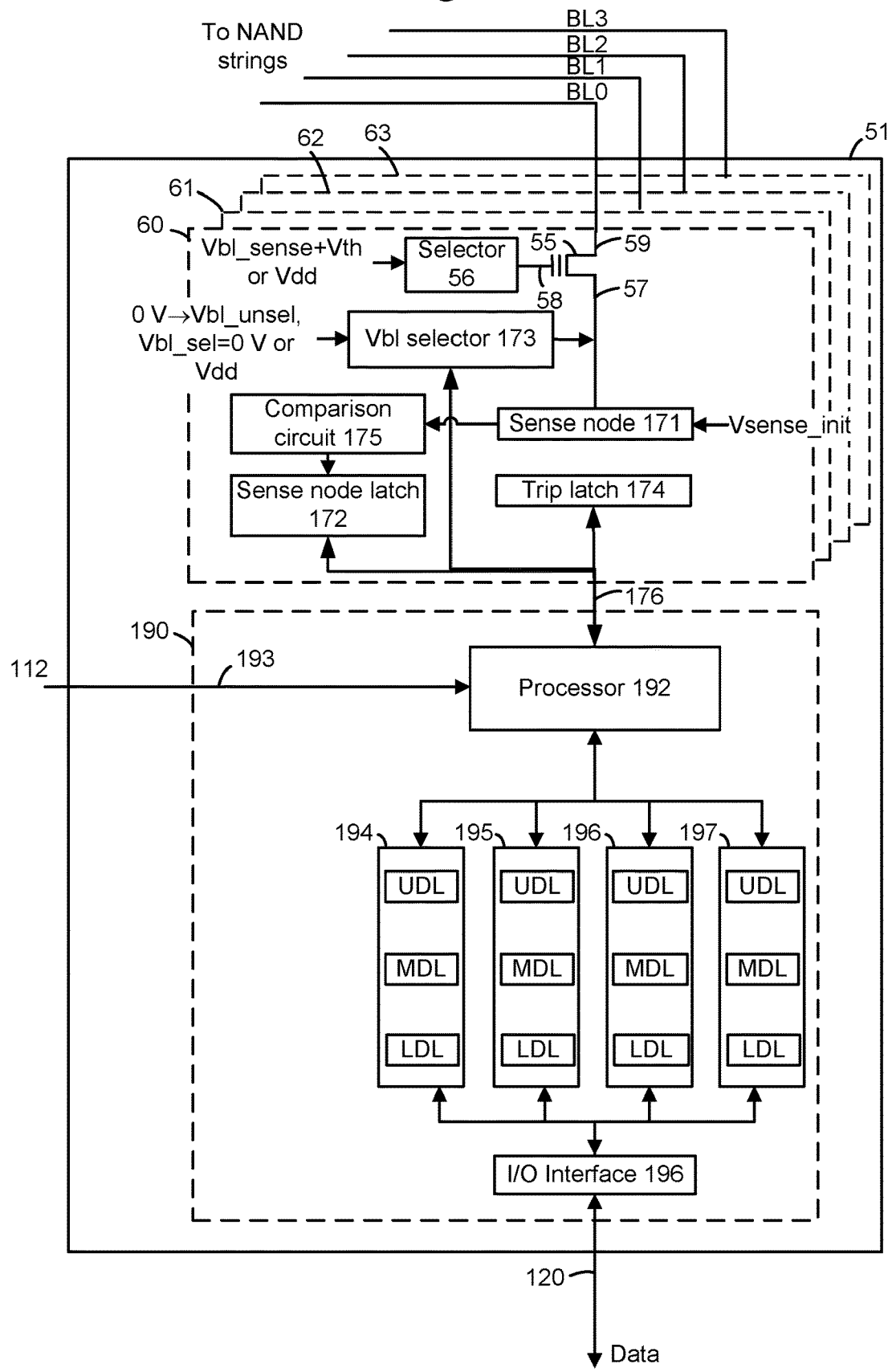
FIG. 2 is a block diagram depicting one embodiment of the sense block 51 of FIG. 1A.

Apparatuses and techniques are described for reducing peak current consumption during a program operation in a memory device.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIG. 8, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5 and 6, for example.

In a 2D memory structure, the memory cells may be arranged in horizontal NAND strings on a substrate.

The memory cells can be programmed to have a threshold voltage (Vth) which corresponds to a data state. See FIG. 9A, for example. The Vth is a function of an amount of charge stored in a charge storing material of the memory cell. A program operation can include a sequence of program loops, where each program loop is performed by applying a program pulse to a selected word line followed by performing one or more verify tests. See FIG. 9B, for example. In particular, a program loop can comprise a pre-charge phase 1090, a program phase 1091, a recovery phase 1092 and a verify phase 1093 as depicted in FIG. 10A. In the verify phase, a waveform referred to as a Vread spike (plot 1005) at t9-t10 can be applied to the selected word line. A Vread spike can also be used in a read operation such as in FIG. 19C. The Vread spike turns on the memory cells so that a channel potential can be equalized. For a read operation, if no Vread spike is applied, a channel gradient can occur which results in hot carrier injection. This worsens reliability on the data word lines, especially after they have experienced read disturb stress over multiple read operations. On the other hand, in a program operation, if no Vread spike is applied during the verify phase, injection disturb can occur on dummy memory cells after several erase/program cycles. In particular the Vth of the dummy memory cells can be shifted higher, impacting the read accuracy of the data memory cells, and worsening reliability. Reliability issues can therefore occur in both program and read operations if the Vread spike is disabled or insufficient time is allocated for it.

Moreover, the increase of the word line voltages to Vread is associated with a peak current consumption. In particular, it has been observed that peak current consumption can be higher in the first program loop of the sequence of program loops than in the remaining program loops under certain conditions. In particular, the peak current consumption is higher in the first program loop when the voltages of the word lines are in a discharged state at the start of the program operation. For example, compare Icc2 in FIG. 11B to Icc1 in FIG. 11A. In particular, the increased peak current has been observed at the start of a verify phase of a program loop, when the voltages of the unselected word lines are increased from a recovery voltage, Vpass2Vread, to the read pass voltage, Vread. For example, see the region 1014 in FIG. 10B.

Moreover, this issue of peak current consumption is expected to worsen in future memory devices which have a higher count of word lines. If the peak current consumption is too high, the power supply will quench and the memory device will not work properly. This situation should be avoided. Reducing peak current consumption can also reduce overall current consumption.

The voltages of the word lines can vary depending on the activities of the memory device. For example, after a sensing operation, which may occur in a read operation or a verify test, the word line voltages are typically allowed to float. The word line voltages are coupled up by the sensing operation and may float at 4-5 V, for example, before discharging gradually to about 0 V. See, e.g., FIG. 19A-19D and Vwl_coupled_up. The discharge can occur over a period of several minutes or hours depending on temperature, for example.

In another example, the word line voltages can be driven at a discharge voltage at or close to 0 V. For example, when the memory device is powered on for use, an operation may occur which checks for bad blocks. This operation involves applying 0 V or other low voltage to the word lines. In another example, the word line voltages can be driven at a low voltage when the block is inactive, while an operation is performed in another block.

A first read condition can be defined for a block and its set of word lines when the word lines are in a discharged state and have a voltage at or close to 0 V. A second read condition can be defined in which the word lines are fully coupled up to a level such as 4-5 V. An intermediate condition can similarly be defined when the word lines have a voltage between the voltages of the first and second read conditions.

Techniques provided herein address the above and other issues. In one aspect, a current reduction countermeasure is implemented in the first program loop of a program operation involving a set of word lines in response to a determination that the set of word lines is in a first read condition at a start of the program operation. The countermeasure can involve the increasing of the voltage of the unselected word lines from a recovery voltage to a read pass voltage. In one approach, the countermeasure involves using a reduced ramp up rate. This reduces peak current because the voltage driver for the unselected word lines can be driven at a lower clock rate. See, e.g., FIGS. 3B-3D, 10H, 10I, 16A and 16B.

In another approach, the countermeasure involves starting to increase the voltage for one group of the unselected word lines, waiting for a delay period, then starting to increase the voltage for another group of the unselected word lines. In other words, the voltages start to ramp up at different times for different groups of word lines. See, e.g., FIGS. 10J, 10L, 17A and 17B.

In another approach, the countermeasure involves reducing the magnitude of the read pass voltage, Vread. See, e.g., FIGS. 10K, 18A and 18B. Generally, the voltage applied to the unselected word lines, Vread, is the same during a verify test and a read operation. A mismatch between the Vread during a verify test and a read operation may result in a read inaccuracy. A lower Vread, Vread_L, can reduce peak Icc, but Vread should not be reduced too much to allow it to serve its function in mitigating injection disturb.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, a power on detection circuit 117, a timer 119 and a word line (WL) voltage detection circuit 121. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach. The power on detection circuit 117 can detect when the memory device is powered on for use, e.g., based on a power on event. The timer 119 can count an elapsed time since a last sensing operation. The timer may increment based on a clock signal used in the storage device. The WL voltage detection circuit 121 can detect a voltage of a representative word line in a set of word lines. See FIG. 20, for example. By detecting the actual voltage of a word lines, an accurate determination can be made about whether a set of word lines is in a first, second or intermediate read condition.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, power on detection circuit 117, timer 119, WL voltage detection circuit 121, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3A to provide the voltage signals of FIGS. 10A-10K, 10J1-10J3 and 10L in accordance with the flowcharts of FIGS. 13A and 13B.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG.

8, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. See also FIG. 9B. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
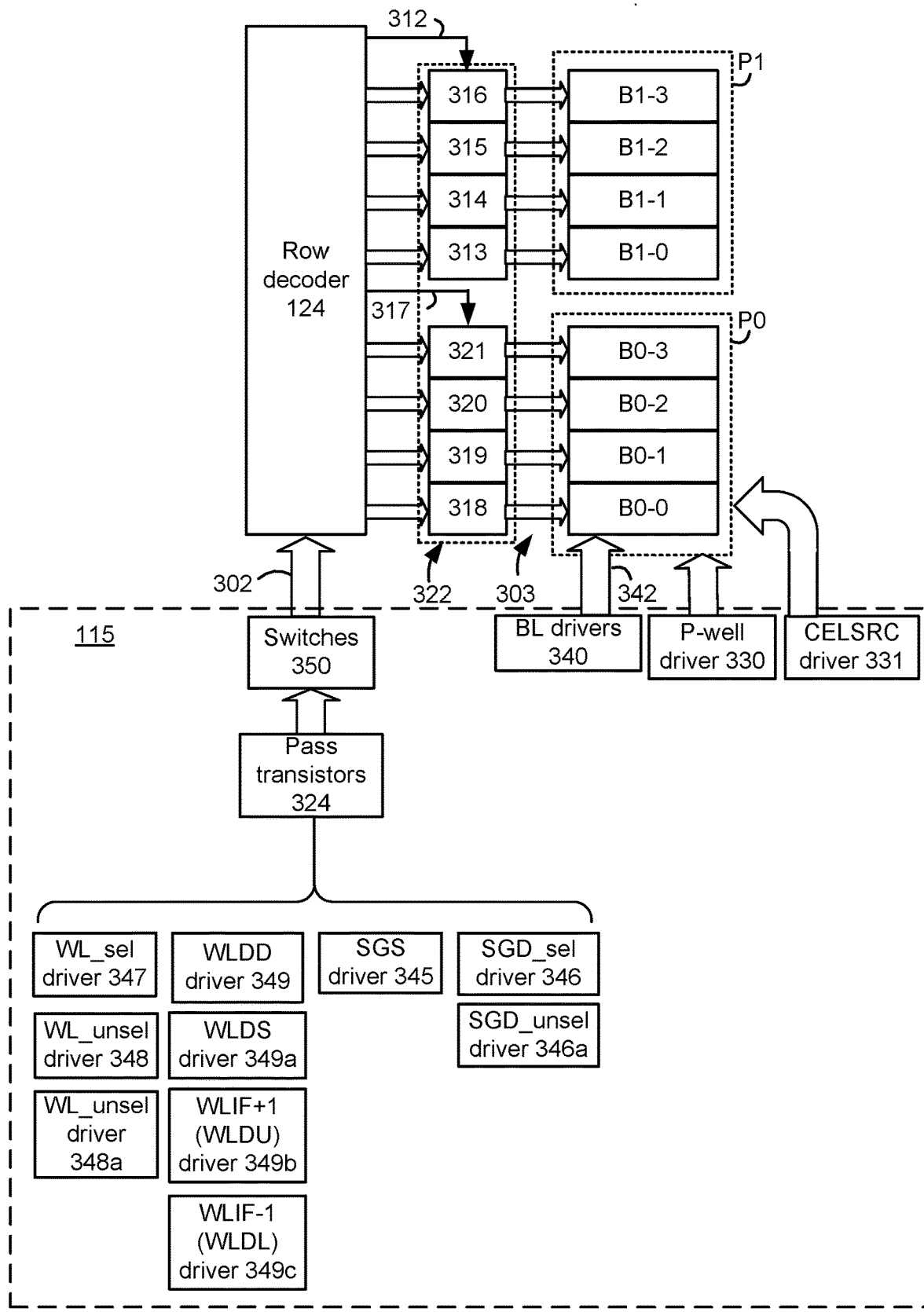
FIG. 3A depicts an example implementation of the power control circuit 115 of FIG. 1A for providing voltages to blocks of memory cells.

FIG. 3A depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 8. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines. For example, the WL_unsel driver 348 can provide a voltage signal to one group of unselected word lines, and the additional WL_unsel driver 348a can provide a voltage signal to another group of unselected word lines. See FIG. 10J1-10J3 for example groups. In one approach, the another group of unselected word lines receives a delayed version of a voltage signal provided to the one group of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349a provides a voltage signal on the source-side dummy word line, WLDS. Moreover, in the case of a two-tier stack, as in FIG. 7, where a bottom tier is separated from a top tier by an interface, a WLIF+1 (WLDU) driver 349b can be used to apply a voltage to the word line adjacent to and above the interface, and a WLIF−1 (WLDL) driver 349c can be used to apply a voltage to the word line adjacent to and below the interface. WLDL is the last word line of the bottom tier and WLDU is the first word line of the top tier.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 3B:
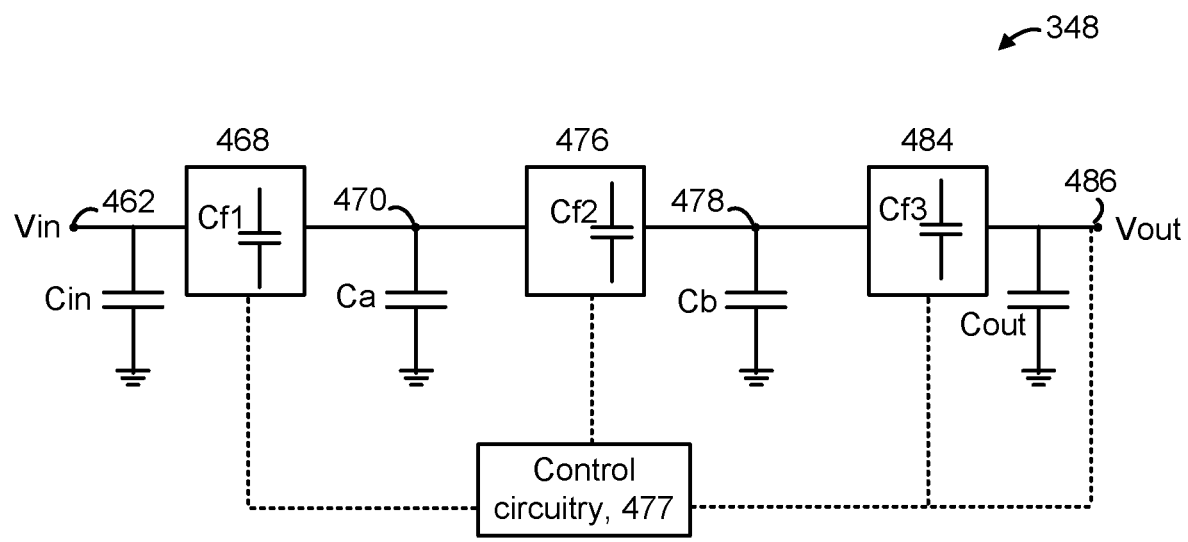
FIG. 3B depicts an example implementation of the WL_unsel driver 348 of FIG. 3A as a multi-stage charge pump.

FIG. 3B depicts an example implementation of the WL_unsel driver 348 of FIG. 3A as a multi-stage charge pump. A charge pump is an example of a voltage driver which can provide a higher output voltage than its input voltage. Vin is provided at input node 462 and Vout is obtained at an output node 486. For example, Vin may be a fixed power supply voltage sometimes referred to as Vdd in a semiconductor chip. Vout could be a word line voltage, for instance.

As an example, three stages 468, 476 and 484 are provided. Each stage 468, 476 and 484 can include switches and one or more flying capacitors Cf1, Cf2 and Cf3, respectively, such as a MOS (metal oxide semiconductor) capacitor. At the node 462, charge from the input voltage is maintained in an input capacitor Cin which is connected to a ground node. At a node 470 which is between the first stage 468 and the second stage 476, a capacitor Ca is connected to a ground node. At a node 478 which is between the second stage 476 and the third stage 484, a capacitor Cb is connected to a ground node. Finally, at the output node 486, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump 348 is operated by control circuitry 477 which controls switching in each stage. The switches may be MOSFETs, bipolar junction transistors or relay switches, for instance.

Based on the switching, charge is transferred from the input node 462 of the first stage to Cf1, and from Cf1 to the node 470. Charge is then transferred from the node 470 of the second stage to Cf2 in the second stage, and from Cf2 to the node 478. Charge is then transferred from the node 478 to Cf3 in the third stage, and from Cf3 to the output node 486.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 477 may communicate with the output node 486 as well such as to detect its level and to make adjustments in the charge pump. For example, a switching frequency can be reduced if Vout is above a target voltage, or increased if Vout is below the target voltage. As discussed further in connection with FIGS. 3C and 3D, Vout is proportional to the switching frequency.

Note that the circuits shown are examples only, as various modifications can be made. Other types of voltage driver circuits could be used as well.

Figure 3C:
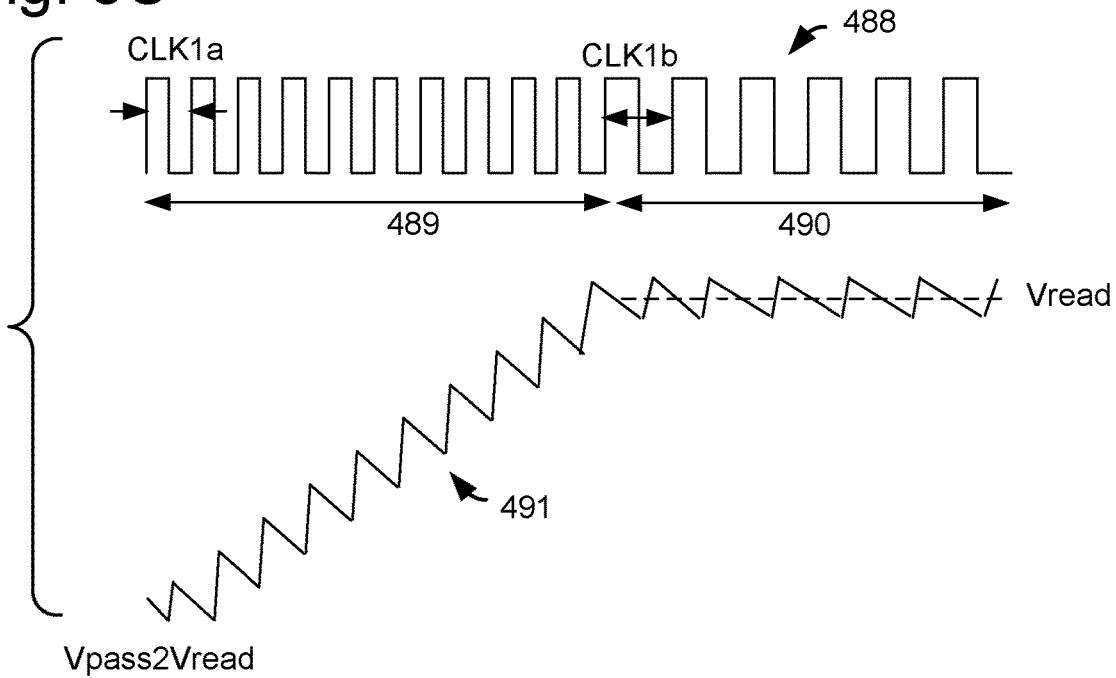
FIG. 3C depicts an example clock signal and output voltage of the charge pump of FIG. 3B where a lower ramp up rate is used.
Figure 3D:
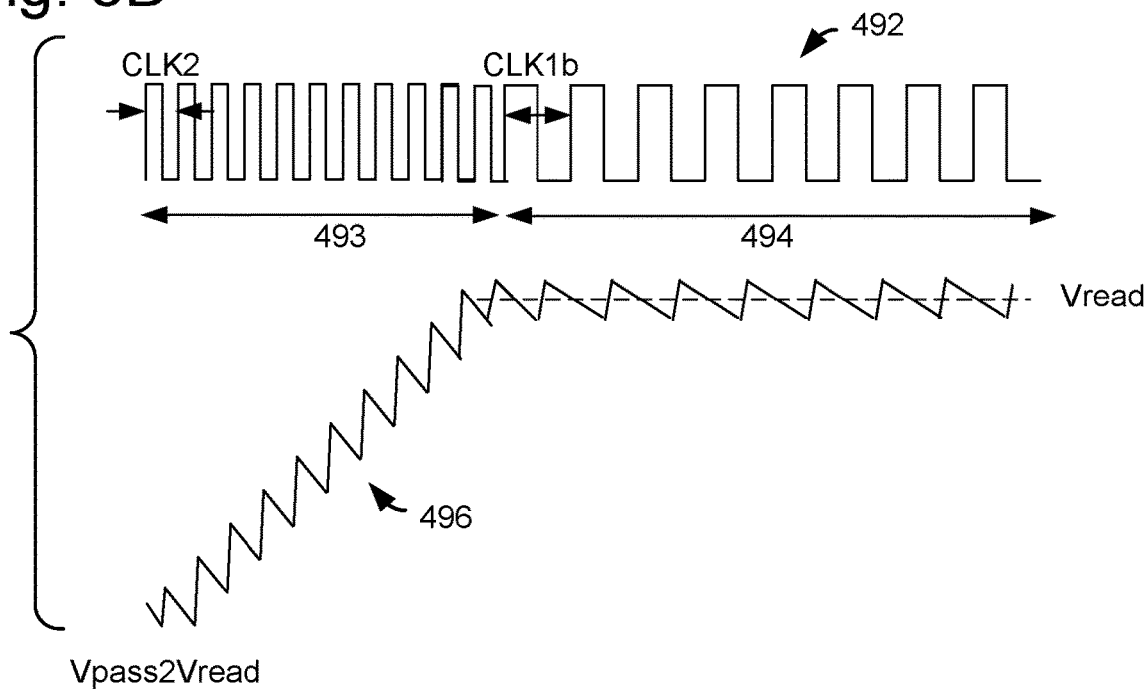
FIG. 3D depicts an example clock signal and output voltage of the charge pump of FIG. 3B where a higher ramp up rate is used.

FIGS. 3C and 3D depicts two example clock signals that are used to achieve different ramp rates for the charge pump of FIG. 3A. FIG. 3C depicts an example clock signal 488 and output voltage 491 of the charge pump of FIG. 3B where a lower ramp up rate (Rlow) is used, e.g., lower relative to the example of FIG. 3D. The clock signal is provided by the control circuitry 477 to activate switches in the stages of the charge pump. The output voltage increases with each charge period, starting from Vpass2Vread and ending at Vread, for example, e.g., 8-10 V. The output voltage has a ripple shape due to the repeated charging and discharging of the capacitors in the charge pump. The clock signal has period CLK1a in a time period 489 in which the output voltage increases. The clock signal then changes to have a period CLK1b>CLK1a in a time period 490 when the output voltage reaches Vread, and the output voltage subsequently remains at Vread. The output voltage can return to 0 V or other initial level at a designated time.

FIG. 3D depicts an example clock signal 492 and output voltage 496 of the charge pump of FIG. 3B where a higher ramp up rate (Rhigh) is used, relative to the example of FIG. 3C. The output voltage increases with each charge period, starting from 0 V and ending at Vread, for example. The clock signal has period CLK2<CLK1a in a time period 493 in which the output voltage increases. The clock signal then changes to have the period CLK1b>CLK2, as in FIG. 3C, in a time period 494 when the output voltage reaches Vread, and the output voltage subsequently remains at Vread.

Figure 4:
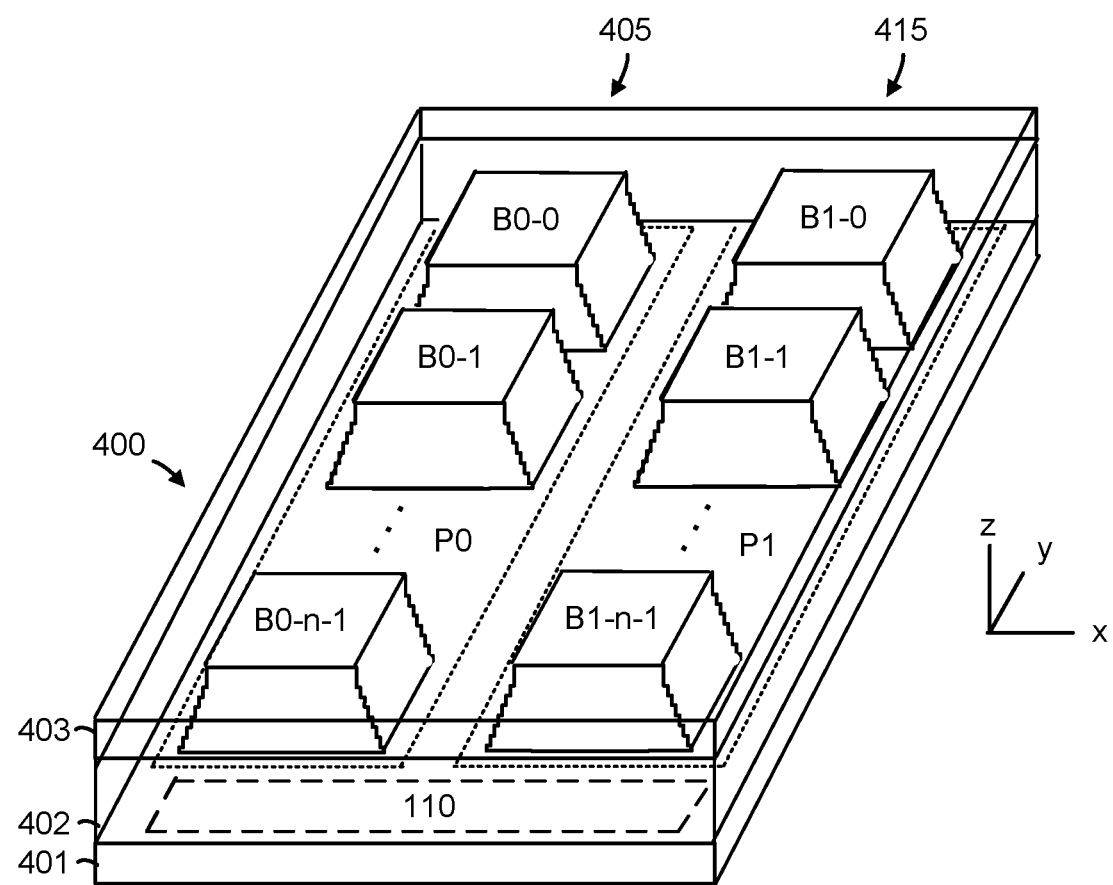
FIG. 4 is a perspective view of an example memory die 400 in which blocks are provided in respective planes P0 and P1, consistent with FIG. 3A.

FIG. 4 is a perspective view of an example memory die 400 in which blocks are provided in respective planes P0 and P1, consistent with FIG. 3A. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-$n$-1, are formed in P0, and a second block sequence 415 of a number n blocks, labelled B1-0 to B1-$n$-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5:
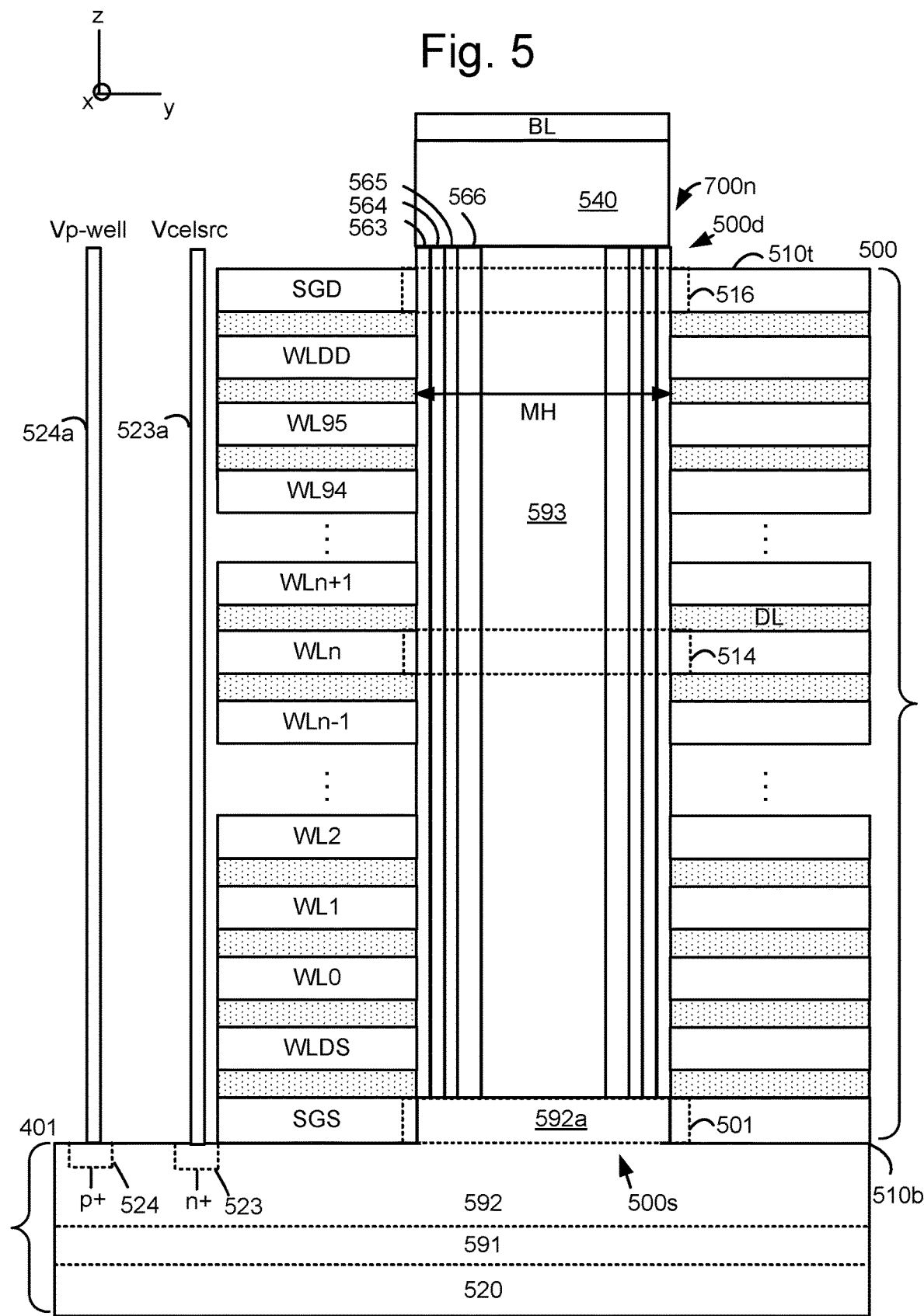
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700$n$. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WL$n$-1, WL$n$, WL$n$+1, . . . , WL94, WL95, WLDD and SGD. WL$n$ denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. For example, see a stack comprising a bottom tier (BT) and a top tier (TT) in FIG. 7. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510$t$ and bottom 510$b$ of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WL$n$ intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592$a$ which extends upward adjacent to the SGS layer. The p-well region can include an n+ contact 523 connected to a local interconnect 523$a$ (a conductive path or source line) for receiving Vcelsrc, and a p+ contact 524 connected to a conductive path 524$a$ for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700$n$ has a source end 500$s$ at a bottom 510$b$ of the stack 500, connected to the p-well. The NAND string 500$n$ also has a drain end 500$d$ at a top 510$t$ of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
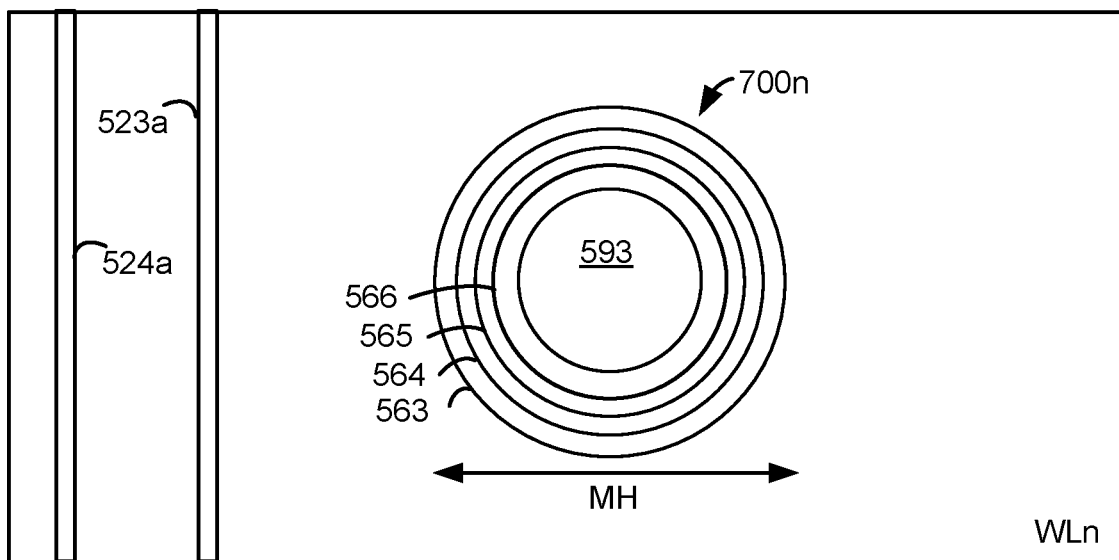
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 7:
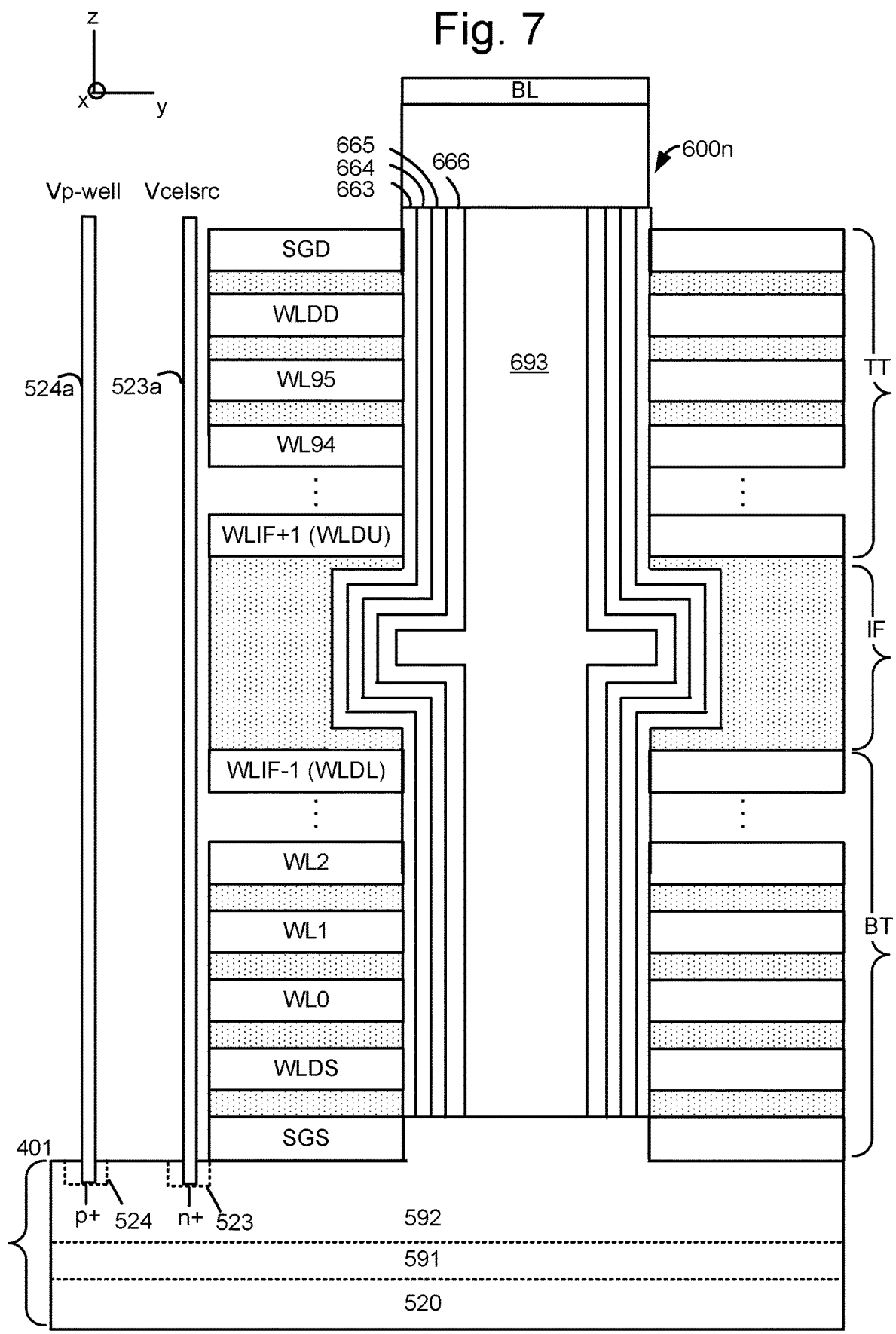
FIG. 7 depicts another example cross-sectional view of a portion of the block B0-0 of FIG. 4, including a NAND string 600n, where the block comprises two tiers.

FIG. 7 depicts another example cross-sectional view of a portion of the block B0-0 of FIG. 4, including a NAND string 600n, where the block comprises two tiers. Like-numbered elements correspond to those in FIG. 5. A multi-tier stack can be taller and have more layers than a single tier stack, which is limited by the ability to accurately etch a memory hole through multiple layers. In a multi-tier stack, a bottom tier of layers is formed and memory holes are etched. A top tier of layers is then formed on the bottom tier and memory holes are etched in the top tier which align with the memory holes in the bottom tier, to form continuous memory holes which extend through both tiers. Two or more tiers can be used. The top of the memory hole of the first tier tends to be widened at the top, in the IF, to form a base for aligning with the later formed memory hole in the top tier. A NAND string 600n is formed which includes a blocking oxide layer 663, a charge-trapping layer 664, a tunneling layer 665, a channel layer 666, and a dielectric core 693.

In this example, the block comprises a stack of alternating conductive and dielectric layers in two tiers, including a bottom tier BT and a top tier TT. The tiers are separated by an interface (IF) region which is formed of a dielectric material. The word lines include, e.g., WL0 to WLIF−1 (WLDL) in the BT, and WLIF+1 (WLDU) to WL95 in the TT, where WLIF−1 is the word line adjacent to and below the IF, and WLIF+1 is the word line adjacent to and above the IF. Optionally, the word lines adjacent to the IF are allocated as dummy word lines WLDL and WLDU.

Additionally, the height of the IF is greater than the height of the remaining dielectric layers between the word lines. As a result, there is a reduced conductivity in the interface so it is more difficult for the electrons to move through the interface.

FIG. 8 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5 to 7. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can provide reduced neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

Figure 9A:
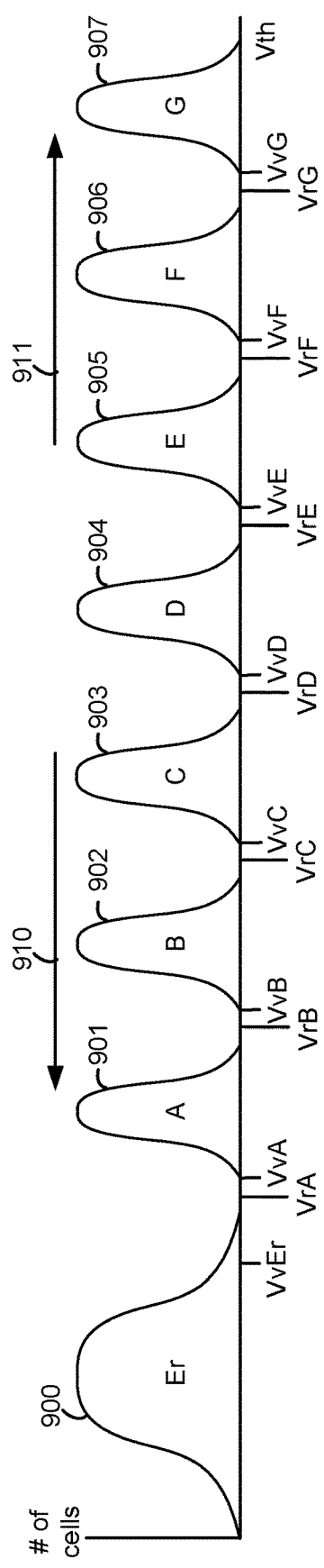
FIG. 9A depicts threshold voltage (Vth) distributions for an eight-state memory device.

FIG. 9A depicts threshold voltage (Vth) distributions for an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 900 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 901-907, respectively. These memory cells are subject to verify tests using verify voltages of VvA-VvG.

In a read operation, the memory cells can be read by applying the read voltages VrA-VrG applied to the selected word line. The data which is programmed or read can be arranged in pages. In one approach, one page of data is read at a time. For example, with eight data states a lower page of data can be read using VrA and VrE, a middle page of data can be read using VrB, VrD and VrF, and an upper page of data can be read using VrC and VrG. See FIG. 19C for an example of reading an upper page of data.

The arrow 910 depicts a decrease in the threshold voltage distributions which can occur when the memory cells and associated word lines transition to a first read condition after being programmed. A decrease in the Vth is typically seen for the lower half of the programmed data states, such as states A-C in this eight-state example. Similarly, the arrow 911 depicts an increase in the threshold voltage distributions which can occur when the memory cells and associated word lines transition to the first read condition. An increase in the Vth is typically seen for the upper half of the programmed data states, such as states E-G in this example.

When the word lines are in a coupled up state, i.e., in the second read condition, the word line voltage tends to prevent a downshift in the Vth of lower state memory cells, since the word line voltage can be greater than the Vth of lower state memory cells. Similarly, the word line voltage tends to prevent an upshift in the Vth of higher state memory cells. When the word lines are in the discharged or first read condition, this tends to allow a downshift in the Vth of the lower state memory cells and an upshift in the Vth of higher state memory cells. The memory cells gradually transition from the second read condition to the first read condition over time, e.g., seconds or minutes, as the word lines are discharged. The shift in the Vth of the memory cells can cause read errors. One approach to avoiding read errors is to adjust the read voltages when the word lines are in the first read condition.

Figure 9B:
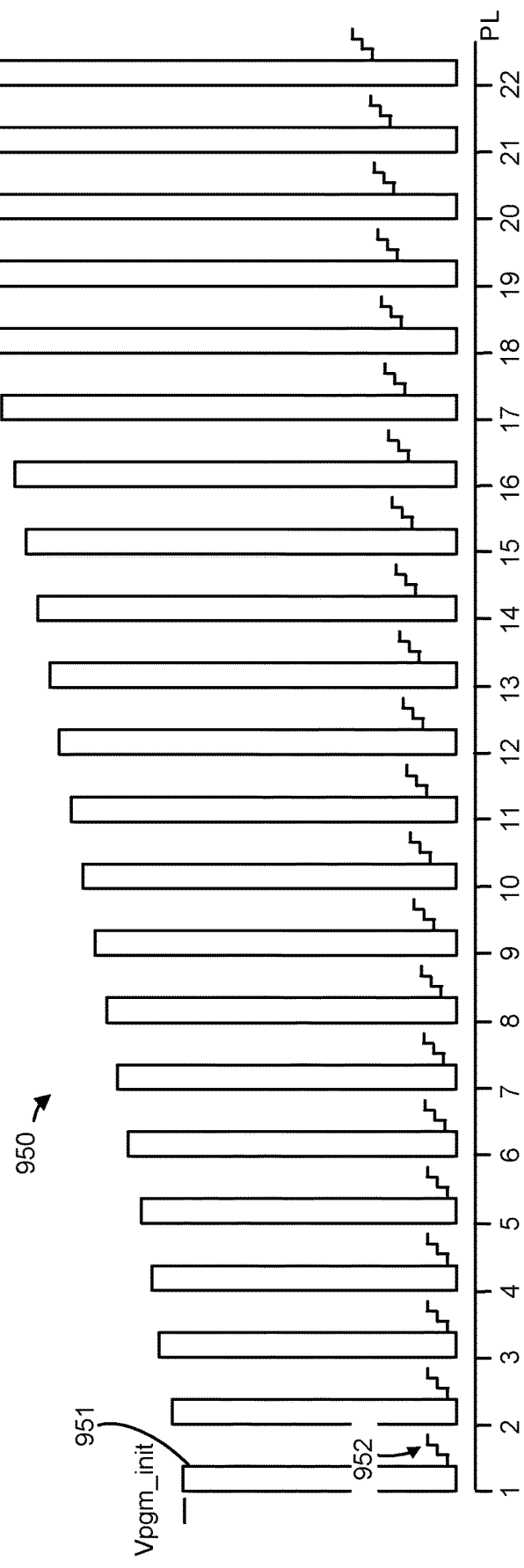
FIG. 9B depicts a voltage signal used in a series of program loops in an example program operation which results in the Vth distribution of FIG. 9A.

FIG. 9B depicts a voltage signal used in a series of program loops in an example program operation which results in the Vth distribution of FIG. 9A. During a program operation, program loops are performed for a selected word line in a selected block. A program loop, or program-verify iteration, comprises a program portion in which a program voltage or pulse is applied to the selected word line followed by a verify portion in which one or more verify voltages are applied to the selected word line. During the application of the verify voltages, verify tests are performed for the associated memory cells.

The voltage signal 950 includes a series of program voltages, including an initial program voltage 951, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level, Vpgm_int, and increases in a step in each successive program loop, for instance, until the program operation is completed. The operation is successfully completed when the threshold voltages of the selected memory cells reach the final verify voltages of the assigned data states.

A program operation can include a single programming pass or multiple programming passes, where each pass uses incremental step pulse programming, for instance.

The verify voltages in each program loop, including example verification signals 952, can encompass lower assigned data states and then midrange assigned data states and then higher assigned data states as the program operations proceeds. The example verify voltages depict three verify voltages as a simplification. The verify voltages are part of a sensing operation. Memory cells are sensed during the application of the verification signal to judge their programming progress. A verify voltage is used to judge the programming progress of a memory cell. For example, see FIG. 10A and verify voltages (plots 1007 and 1008) for the A and B state, VvA and VvB, respectively. The result of sensing of the Vth relative to its verify voltage can be used to inhibit further programming of a memory cell.

In FIG. 10A-10G, the vertical dimension denotes voltage and the horizontal dimension denotes time, with time points t0-t13. The period of time depicted corresponds to one program loop and includes a pre-charge phase 1090 (t0-t2), a program phase 1091 (t2-t4), a recovery phase 1092 (t4-t9) and a verify phase 1092 (t9-t13). The voltages depicted are examples.

FIG. 10A depicts voltages applied to a selected word line, WLn in a first program loop of a program operation, consistent with FIG. 9B.

A plot 1001 represents 1 V, a plot 1002 represents a program pass voltage, Vpass, a plot 1003 represents a program voltage of Vpgm, a plot 1004 represents a positive recovery voltage of Vcc=3 V, a plot 1005 represents a voltage pulse at Vread, a plot 1006 represents 0 V, and plots 1007 and 1008 represent example verify voltages VvA and VvB, respectively. During the application of each verify voltage, a sensing operation occurs for the selected memory cells which are assigned to the data state being verified. The selected memory cells are connected to a selected word line, and can be in a selected sub-block. A program pulse comprises the plots 1002 and 1003.

FIG. 10B depicts a voltage, VWL_unsel, applied to unselected word lines, consistent with FIG. 10A. A plot 1010 represents 1 V, a plot 1011 represents Vpass=10 V, and a plot 1012 represents a positive recovery or transition voltage, Vpass2Vread. This refers to a voltage which is applied in a transition from the program pass voltage to the read pass voltage. A region 1014 represents an increase in VWL_unsel from Vpass2Vread to Vread. See FIGS. 10H-10K, 10J1-10J3 and 10L for example voltage signals. A plot 1013 represents Vread.

FIG. 10C depicts a voltage, Vbl_pgm, applied to bit lines of programmed NAND strings, consistent with FIG. 10A. A plot 1020 represents 1 V, and a plot 1021 represents 0.5 V.

FIG. 10D depicts a voltage, Vbl_inh, applied to bit lines of inhibited NAND strings, consistent with FIG. 10A. These are inhibited NAND strings in a selected sub-block. A plot 1030 represents 2 V and a plot 1031 represents 0 V at t7-t9 in the recovery phase. A plot 1032 represents 2 V in the verify phase.

FIG. 10E depicts a voltage, Vsgd_sel, applied to SGD transistors of a selected sub-block, consistent with FIG. 10A. A plot 1040 represents 8 V, a plot 1041 represents 2.5 V, a plot 1042 represents 0 V and a plot 1043 represents 8 V.

FIG. 10F depicts voltages applied to SGD transistors of unselected sub-blocks and to SGS transistors, consistent with FIG. 10A. A plot 1050 represents 8 V and a plot 1051 represents 2.5 V for Vsgd_unsel and Vsgs. A plot 1052 represents 8 V for Vsgs and a plot 1053 represents 0 V for Vsgd_unsel.

FIG. 10G depicts a voltage applied to a source line, consistent with FIG. 10A. A plot 1060 represents 1 V, a plot 1061 represents 0 V and a plot 1062 represents 1 V. In the pre-charge phase, a positive Vbl_inh (plot 1030) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. A plot 1031 represents Vbl_inh returning to 0 V at t7-t9 in part of the recovery phase, and a plot 1032 represents Vbl_inh at 2 V during the verify phase, for example.

In the program phase, VWLn and Vwl_unsel are ramped up, e.g., starting at t2, to provide a capacitive coupling up of the channels of the inhibited NAND strings. VWLn is then ramped up further at t3 to the peak level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block. Before the verify tests, VWLn is ramped up with VWL_unsel to equalize the channel potential.

During the program pulse, Vsgd_sel is high enough to provide the selected SGD transistors in a conductive state for the programmed NAND strings, which receive Vbl_pgm=0 V, but low enough to provide the selected SGD transistors in a non-conductive state for the inhibited NAND strings, which receive Vbl_inh=2 V.

During the verify phase, the SGD and SGS transistors are in a strongly conductive state to allow sensing to occur for the selected memory cells.

FIG. 10H-10K depict example voltage signals consistent with the region 1014 of FIG. 10B, and are consistent with the time point t9. These figures depict examples of current reduction countermeasures which can be used alone or in combination.

FIG. 10H depicts example voltage signals consistent with the region 1014 of FIG. 10B, where there is a continuous increase in the voltage signals (plots 1070-1072), and example rates of increase are Rhigh (a high rate), Rint (an intermediate rate between Rhigh and Rlow) and Rlow (a low rate), respectively. The peak current consumption is believed to be due to the voltage driver for the unselected word lines and can be reduced by reducing the ramp up rate. For example, the peak current consumption is highest with Rhigh, lower with Rint and even lower with Rlow. While this example provides three ramp up rates, in general, two or more may be used. As mentioned in connection with FIGS. 3C and 3D, a clock rate of the voltage driver can be adjusted to adjust the ramp up rate.

When the ramp up rate is decreased, the time period in which the voltage increases from Vpass2Vread to Vread increase. For example, with Rhigh, Rint and Rlow, the time period is a, b or c, respectively. Each voltage signal starts to increase concurrently at t9 in this example.

FIG. 10I depicts example voltage signals consistent with the region 1014 of FIG. 10B, where there is a continuous increase in the voltage signal (plot 1070), a stepped increase in the voltage signals (plots 1073 and 1074), and example rates of increase are Rhigh, Rint and Rlow, respectively. This is another example of reducing the ramp up rate. As an alternative to a continuous increase, a stepped increase can be used, as in plots 1073 and 1074. Generally, two or more steps can be used. The voltage signal (plot 1073) includes a first increase from Vpass2Vread to an intermediate level, Vint, between Vpass2Vread and Vread, followed by a period in which the voltage output is constant at Vint, followed by a second increase from Vint to Vread.

The voltage signal 1074 includes a first increase from Vpass2Vread to a first intermediate level, Vint1, followed by a period in which the voltage output is constant at Vint1, followed by a second increase from Vint1 to a second intermediate level, Vint2, followed by a period in which the voltage output is constant at Vint2, followed by a third increase from Vint2 to Vread. Each voltage signal starts to increase concurrently at t9.

FIG. 10J depicts example voltage signals consistent with the region 1014 of FIG. 10B, where a start of an increase in the voltage signals 1075 and 1076 is delayed relative to a start of an increase in the voltage signal 1075 by d1 and d2, respectively. By offsetting the voltage signals for different groups of unselected word lines, the peak current consumption can be reduced, since the load on the voltage drivers is spread out in time. Moreover, a capacitance between the word lines and the memory hole is reduced. Generally, offset voltage signals for two or more groups of word lines can be used. This example includes three groups of word lines. For example, see the groups in FIG. 10J1-10J3.

Each voltage signal has a continuous increase from Vpass2Vread to Vread in this example, but other options are possible, such as a stepped increase. The voltage signal (plot 1070) starts to increase at t9. After a delay of d1 relative to t9, the voltage signal 1075 starts to increase. After a delay of d2 relative to t9, the voltage signal 1076 starts to increase.

FIG. 10J1 depicts two example groups of unselected word lines, groups 1080 and 1081, consistent with FIG. 10J. In one approach, each group has about the same number of word lines, e.g., one half of the unselected word lines in this example. Although, other options are possible. The group 1080 comprises WDLS, WL0-WLn−1 and WLn+1 to WL47, and the group 1081 comprises WL48-WL95 and WLDD. In this example, the selected word line WLn is excluded from the current reduction countermeasure. However, it is possible to include it, in which case the group 1080 would include WLDS and WL0-WL47. The current consumption for the voltage driver of WLn is relatively low since just one word line is driven, compared to the voltage driver or drivers of the many unselected word lines. Complexity can be reduced by omitting the current reduction countermeasure for WLn, in one possible approach.

In another option, the groups are significantly different in size. For example, the first ramped up group can comprise a majority of the word lines, e.g., WL0-WLn−2 and WLn+2 to WL95. The group with the delayed ramp up can comprise remaining word lines, including the data word lines WLn−1 and WLn+1 and the dummy word lines WLDS and WLDD. Other options are possible.

FIG. 10J2 depicts programmed and unprogrammed groups of unselected word lines, groups 1080a and 1081a, consistent with FIG. 10J. In this approach, the voltage of one group of word lines 1081a, comprising WLn+1 to WL95, is increased first, followed by an increase in the voltage of another group of word lines 1080a, comprising WL0 to WLn−1. Based on a word line programming order which starts at WL0 and proceeds one word line at a time until the last word line, WL95, the word lines in the group 1081a will be unprogrammed (e.g., the associated memory cells are unprogrammed and therefore in the erased state) while the word lines in the groups 1080a will be programmed (e.g., the associated memory cells are programmed and therefore in various programmed states as well as the erased state).

In this example, the one group of the unselected word lines 1081a is after the selected word line in a word line program order, and the another group of the unselected word lines 1080a is before the selected word line in the word line program order.

If another word line program order was used, such as WL95 to WL0 (a reverse program order), the voltage for the group 1080a can be increased before the voltage for the group 1081a.

FIG. 10J3 depicts three example groups of unselected word lines, groups 1082-1084, consistent with FIG. 10J. In this example, each group has about the same number of word lines, e.g., one third of the unselected word lines. The group 1082 comprises WLDS, WL0-WLn−1 and WLn+1 to WL31, the group 1083 comprises WL32-WL63 and the group 1084 comprises WL64-WL95 and WLDD.

FIG. 10K depicts example voltage signals consistent with the region 1014 of FIG. 10B, where the voltage signals of plots 1070, 1077 and 1078 have magnitudes of Vread, Vread_int and Vread_L, respectively. By reducing the read pass voltage, the peak current consumption can be reduced, since the span of the increase of the voltage signal is reduced. Generally, two or more levels of Vread can be used. This example includes three levels. For example, plots 1070, 1077 and 1078 depict Vread, Vread_int and Vread_L, respectively, where Vread>Vread_int>Vread_L. The read pass voltage should be sufficiently high to provide the unselected memory cells in a strongly conductive state during the sensing of a selected memory cell. However, there is some margin to reduce Vread, such as by up to 0.5 V.

In an example, to implement a current reduction countermeasure when the set of word lines is in the first read condition, the control circuit is configured to set a first level (VreadL) for the read pass voltage, and when the set of word lines is in the second read condition, the control circuit is configured to set a second level (Vread), which is greater than the first level, for the read pass voltage.

FIG. 10L depicts example voltage signals consistent with the region 1014 of FIG. 10B, where a start of an increase in the voltage signal (plot 1080) for a group of word lines occurs before a start of the increase of Vsgd_sel (plot 1052). As in FIG. 10E, Vsgd_sel increases from 0 V, in which the SGD transistors will be in a non-conductive state, to 8 V, for example, in which the SGD transistors will be in a conductive state, starting at t9. In this example, plot 1080 depicts a voltage signal for one group of unselected word lines starting to increase at t9-d2, before the start of the increase of Vsgd_sel at t9. Accordingly, for a period of time d2, the word line voltage signal increases while the SGD transistors remain in a non-conductive state. As a result, a current cannot conduct in the channel of the NAND strings so that a capacitance between the word lines and the memory hole is reduced and current consumption is therefore also reduced. Plot 1070 depicts the voltage signal for another group of word lines starting to increase at t9, concurrent with the increase of Vsgd_sel.

In an example implementation, a start of the increase of the voltage of one group of the unselected word lines occurs before a start of an increase of a voltage signal applied to the drain end select gate transistors. A start of the increase of the voltage of the another group of the unselected word lines may be concurrent with the start of the increase of the voltage signal applied to the drain end select gate transistors.

Figure 11A:
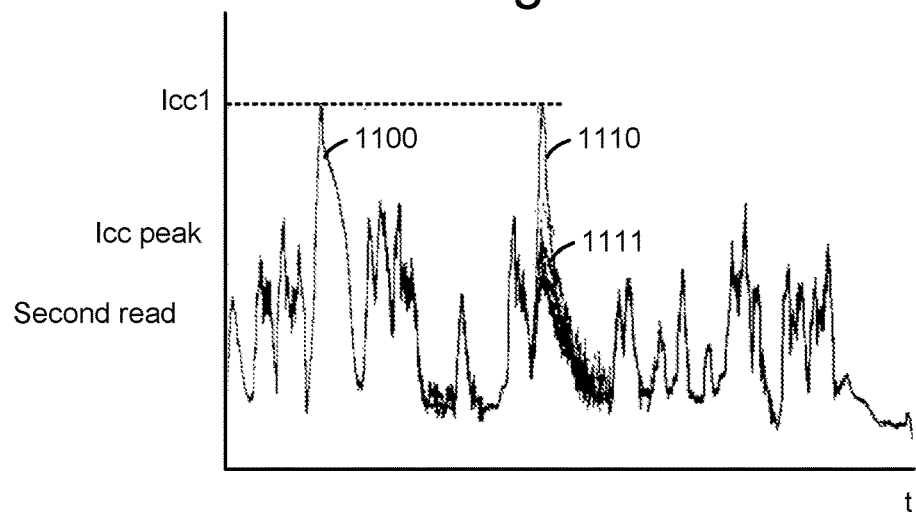
FIG. 11A depicts a current consumption versus time in a program loop when the set of word lines is in a second read condition.

FIG. 11A depicts a current consumption versus time in a program loop when the set of word lines is in a second read condition. In this case, there is a peak in current consumption of Icc1 (plot 1100) due to a ramp up of the bit line voltage in the pre-charge phase. For example, see FIG. 10D at t0. Although the bit line voltage is only increased from 0-2 V, for example, there are many bit lines and they are relatively long so that they have a high capacitance. This results in a relatively high load on the bit line voltage driver.

There is an additional peak in current consumption due to a ramp up of the unselected word lines (plot 1110) in the verify phase. This peak is also at about Icc1. For example, see FIG. 10B at t9. The increase in the voltage from Vpass2Vread is significant and results in a relatively high load on the word line voltage driver or drivers. The plot 1111 represents a reduction in the peak current consumption when a current reduction countermeasure (a reduced ramp up rate) is implemented as discussed herein.

Figure 11B:
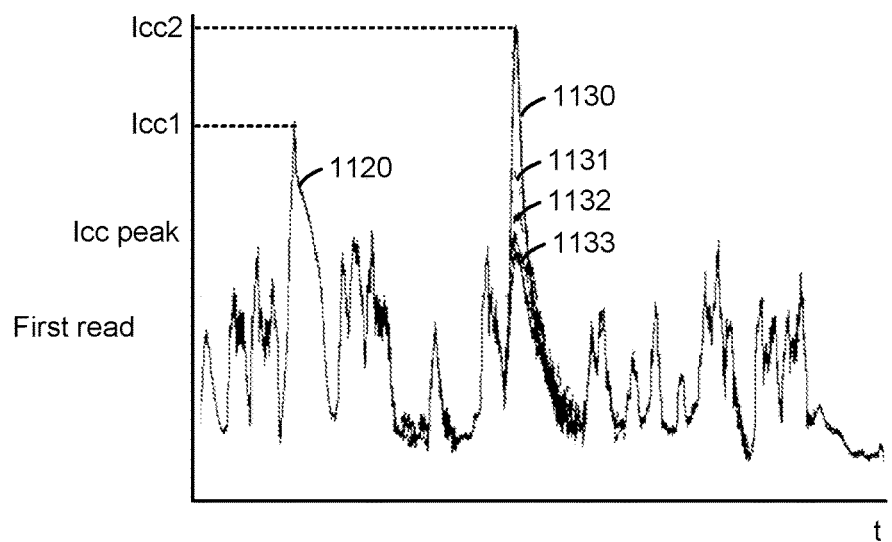
FIG. 11B depicts a current consumption versus time in a program loop when the set of word lines is in a first read condition.

FIG. 11B depicts a current consumption versus time in a program loop when the set of word lines is in a first read condition. As in FIG. 11A, there is a peak in current consumption of Icc1 (plot 1120) due to a ramp up of the bit line voltage in the pre-charge phase. There is an additional peak in current consumption, at a higher level of Icc2, due to a ramp up of the unselected word lines (plot 1130) in the verify phase. The presence of the first read condition therefore increases the peak current consumption. This is believed to be due to an effect on the channel equalization in the recovery phase. The plots 1131-1133 represent a progressively larger reduction in the peak current consumption when progressively stronger current reduction countermeasures are implemented as discussed herein. Specifically, the ramp up rate is lower for the plot 1131 compared to the plot 1130, lower for the plot 1132 compared to the plot 1131, and lower for the plot 1133 compared to the plot 1132. This demonstrates the effectiveness of the current reduction countermeasures in reducing the peak current.

Figure 12:
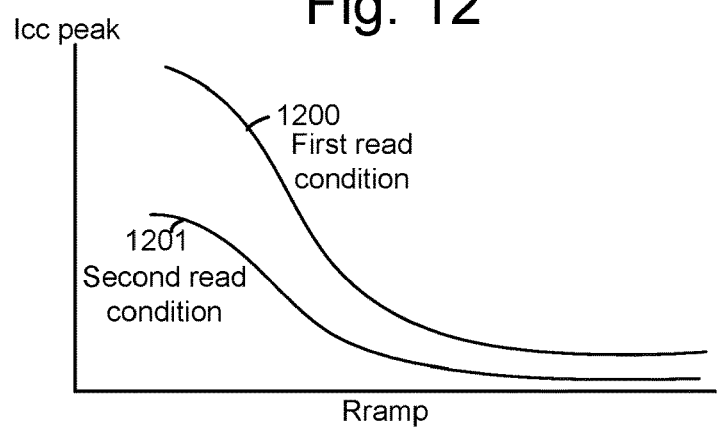
FIG. 12 depicts a plot of a peak current consumption in a program loop as a function of a ramp rate (Rramp) of a voltage signal applied to unselected word lines, consistent with FIG. 11B.

FIG. 12 depicts a plot of a peak current consumption in a program loop as a function of a ramp rate (Rramp) of a voltage signal applied to unselected word lines, consistent with FIG. 11B. As mentioned, a lower ramp rate (Rramp) results in a lower peak current (Icc peak). Additionally, the reduction in the peak current is stronger when the word lines are in the first read condition (plot 1200) than when the word lines are in the first read condition (plot 1201).

Figure 13A:
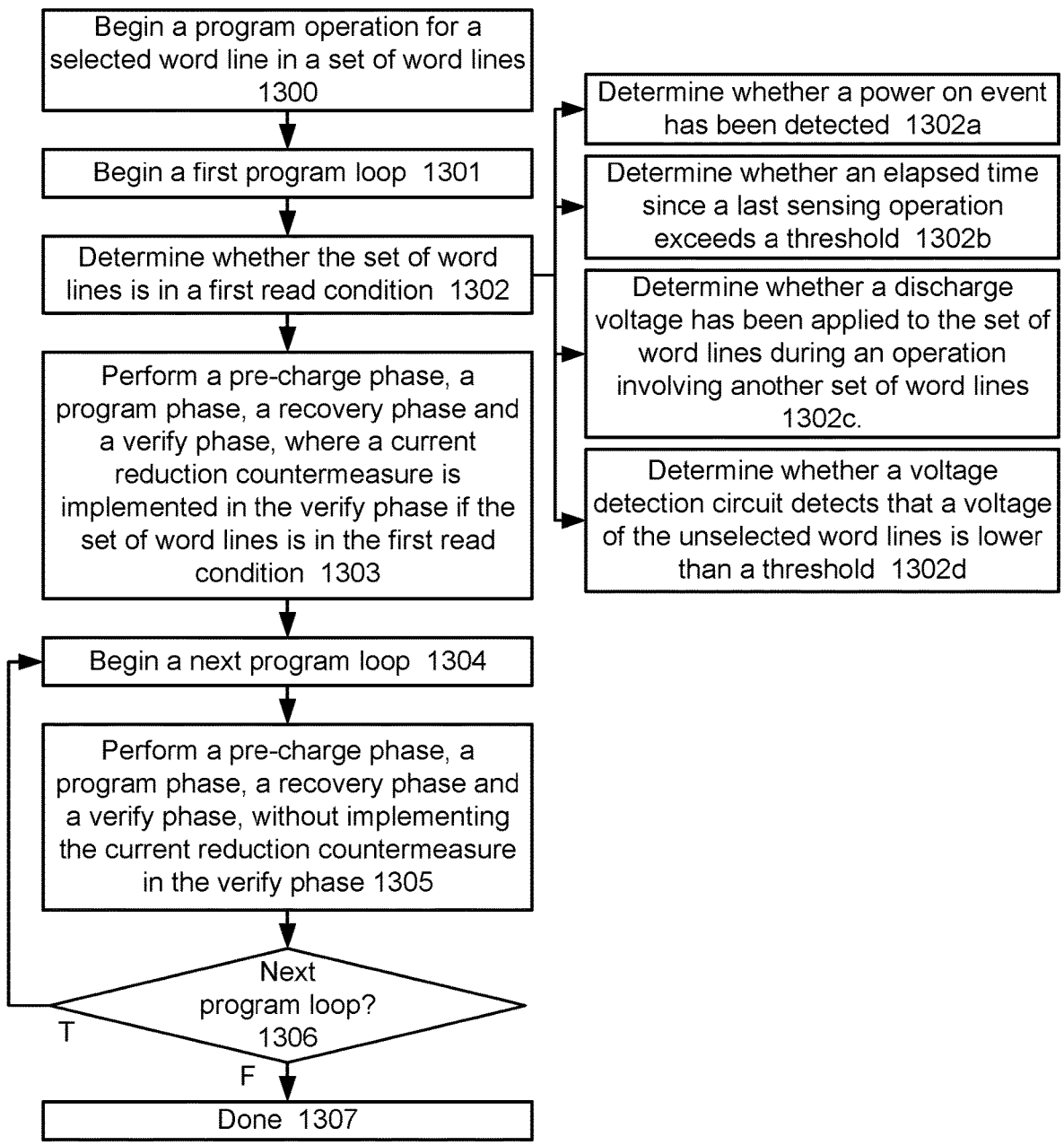
FIG. 13A depicts a flowchart of an example program operation which implements a current reduction countermeasure.

FIG. 13A depicts a flowchart of an example program operation which implements a current reduction countermeasure. Step 1300 begins a program operation for a selected word line in a set of word lines. For example, these can be the word lines of a block, as in FIG. 8. The program operation can comprise a single program pass in which a voltage signal 950 such as in FIG. 9B is used. In this case, the current reduction countermeasure can be implemented in the first program loop of the program pass, since this is when the first read condition and the associated peak current consumption may occur. In other examples, the program operation comprises multiple program passes, in which case the current reduction countermeasure can be implemented in the first program loop of the first program pass of the multiple program passes, since this is when the first read condition and the associated peak current consumption may occur.

Step 1301 begins a first program loop of the program operation. Step 1302 determines whether the set of word lines is in a first read condition. This determination can involve one or more steps and can be made at a start of the program operation. For example, step 1302a involves determining whether a power on event has been detected. This can be done by the power on detection circuit 117 of FIG. 1A, for example. Step 1302b involves determining whether an elapsed time since a last sensing operation exceeds a threshold. This can be done by the timer 119 of FIG. 1A, for example. See also FIGS. 14A and 14B.

Step 1302c includes determining whether a discharge voltage, e.g., 0 V, has been applied to the set of word lines during an operation involving another set of word lines. This can be done by the state machine 112 of FIG. 1A, for example. In one example, in FIG. 3A, the control signal on the block enable line 317 enables a set of blocks B0-0 to B0-3 by turning on the respective pass transistors 318-321. In the set of blocks, B0-0 may initially be a selected block in which a program operation occurs, while B0-1 to B0-3 are unselected blocks which have a discharge voltage applied to their word lines. In a subsequent program operation, B0-1 may be a selected block, while B0-0, B0-2 and B0-3 are unselected blocks which have a discharge voltage applied to their word lines. At the time of its programming, B0-1 therefore comprises a set of word lines to which a discharge voltage has been applied during an operation involving another set of word lines of B0-0.

Step 1302d involves determining whether a voltage detection circuit detects that a voltage of the unselected word lines is lower than a threshold. This can be done by the WL voltage detection circuit 121 of FIGS. 1A and 20, for example. See also FIGS. 15A and 15B.

Step 1303 involves performing a pre-charge phase, a program phase, a recovery phase and a verify phase of the program loop (see FIG. 10A-10G), where a current reduction countermeasure is implemented in the verify phase if the set of word lines is in the first read condition. Step 1304 begins a next program loop. Step 1305 involves performing a pre-charge phase, a program phase, a recovery phase and a verify phase of the program loop, without implementing the current reduction countermeasure in the verify phase. Thus, in each program loop of the program operation after the first program loop, the current reduction countermeasure in the verify phase can be omitted. This saves time in these program loops because the rate of increase of the voltage of the unselected word lines can be at the high ramp up rate.

A decision step 1306 determines whether there is a next program loop to perform. The decision step is true (T) if the program operation is not yet completed, e.g., the memory cells have not completed programming to their assigned data states. Step 1304 then follows. The decision step is false (F) if the memory cells have completed programming to their assigned data states, in which case the program operation is done at step 1307.

Figure 13B:
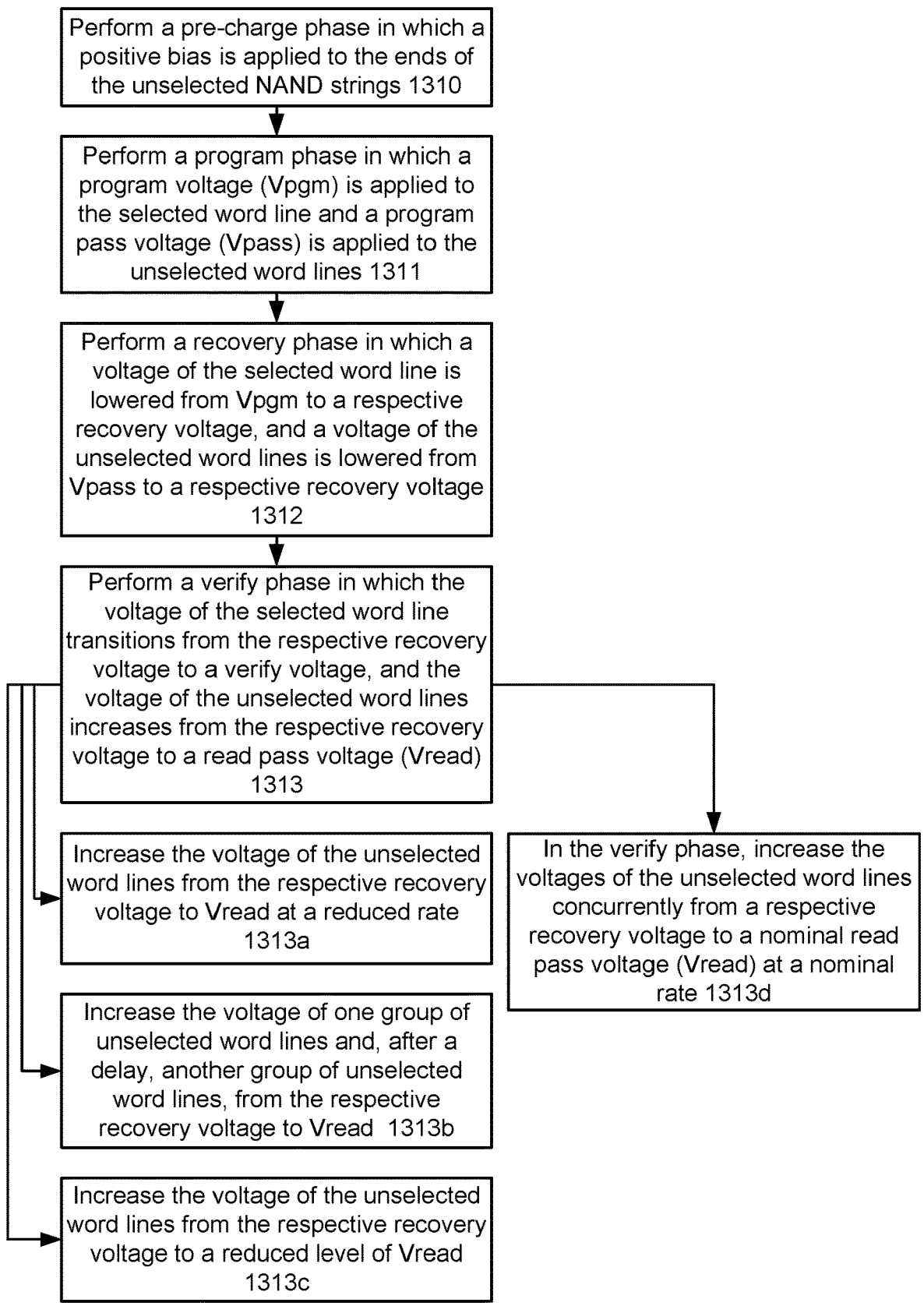
FIG. 13B depicts a flowchart of an example process for performing a pre-charge phase, a program phase, a recovery phase and a verify phase in a first program loop of a program operation, consistent with FIG. 13A, step 1303 and 1305.

FIG. 13B depicts a flowchart of an example process for performing a pre-charge phase, a program phase, a recovery phase and a verify phase in a first program loop of a program operation, consistent with FIG. 13A, step 1303 and 1305. Step 1310 includes performing a pre-charge phase in which a positive bias is applied to the ends of the unselected NAND strings, e.g., in a selected block in which the program operation occurs. For example, see Vbl_inh and Vsl in the pre-charge phase 1090 of FIGS. 10D and 10G.

Step 1311 includes performing a program phase in which a program voltage (Vpgm) is applied to the selected word line and a program pass voltage (Vpass) is applied to the unselected word lines. For example, see VWLn and VWL_unsel in the pre-charge phase 1090 of FIGS. 10A and 10B.

Step 1312 includes performing a recovery phase in which a voltage of the selected word line is lowered from Vpgm to a respective recovery voltage (e.g., Vcc), and a voltage of the unselected word lines is lowered from Vpass to a respective recovery voltage (e.g., Vpass2Vread). For example, see VWLn and VWL_unsel in the recovery phase 1092 of FIGS. 10A and 10B.

Step 1313 includes performing a verify phase in which the voltage of the selected word line transitions from the respective recovery voltage to Vread, to 0 V and then to a verify voltage (e.g., VvA), and the voltage of the unselected word lines increases from the respective recovery voltage to a read pass voltage (e.g., Vread). For example, see VWLn and VWL_unsel in the verify phase 1093 of FIGS. 10A and 10B. The performing of the verify phase can involve one or more current reduction countermeasures such as depicted in steps 1313a-1313c. These are consistent with step 1303 of FIG. 13A, where the first read condition is detected before the first program loop. Or, in step 1313d, the performing of the verify phase can omit the current reduction countermeasure, consistent with step 1305 of FIG. 13A, where the first read condition is not detected before the first program loop.

Step 1313a involves increasing the voltage of the unselected word lines from the respective recovery voltage to Vread at a reduced rate, e.g., consistent with FIGS. 10H and 10I. This step can involve determining a rate of increase for the increasing of the voltage of the unselected word lines from among a plurality of available rates, such as Rhigh, Rint and Rlow.

Step 1313b involves increasing the voltage of one group of unselected word lines and, after a delay, another group of unselected word lines, from the respective recovery voltage to Vread, e.g., consistent with FIG. 10J.

Step 1313c involves increasing the voltage of the unselected word lines from the respective recovery voltage to a reduced level of Vread, e.g., consistent with FIG. 10K.

Step 1313d involves, in the verify phase, increasing the voltages of the unselected word lines concurrently from a respective recovery voltage to a nominal read pass voltage (Vread) at a nominal (high) rate, e.g., consistent with FIG. 10H, plot 1070.

Figure 14A:
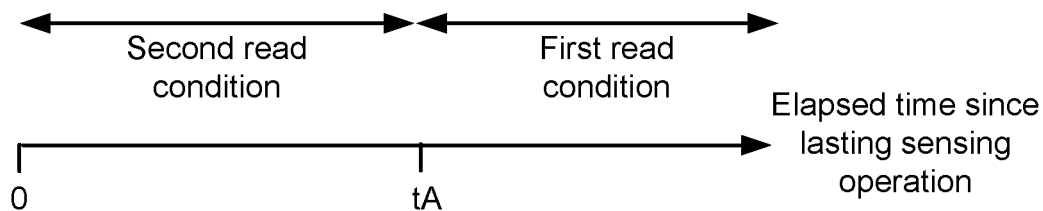

FIG. 14A shows how a first or second read condition is a function of a time since a last sensing operation, in an example implementation of FIG. 13A, step 1302a. The horizontal dimension depicts an elapsed time since a last sensing operation, where 0 denotes the time of the last sensing operation, and tA denotes a time which may be several minutes later, for example. A second read condition exists when the elapsed time is between 0 and tA and a first read condition exists when the elapsed time is greater than tA.

Figure 14B:
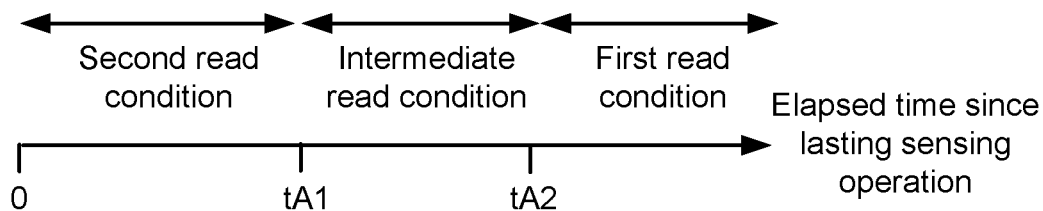
FIG. 14B shows how a first, intermediate or second read condition is a function of a time since a last sensing operation, in an example implementation of FIG. 13A, step 1302b.

FIG. 14B shows how a first, intermediate or second read condition is a function of a time since a last sensing operation, in an example implementation of FIG. 13A, step 1302b. One or more intermediate read conditions can be defined to provider a finer measurement of the state of the word line voltages and to optimize the current reduction countermeasure accordingly. The horizontal dimension depicts an elapsed time since a last sensing operation, where 0 denotes the time of the last sensing operation, and tA1 and tA2 denote later times. A second read condition exists when the elapsed time is between 0 and tA, an intermediate read condition exists when the elapsed time is between tA1 and tA2, and a first read condition exists when the elapsed time is greater than tA2.

Figure 15A:
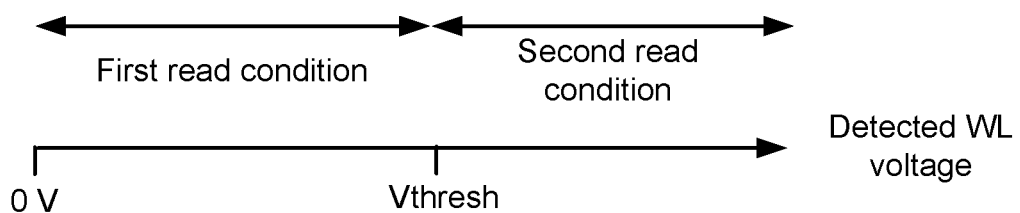
FIG. 15A shows how a first or second read condition is a function of a detected word line voltage, in an example implementation of FIG. 13A, step 1302d.

FIG. 15A shows how a first or second read condition is a function of a detected word line voltage, in an example implementation of FIG. 13A, step 1302d. The horizontal dimension depicts a detected word line voltage relative to a threshold, Vthresh>0 V. A first read condition exists when the detected word line voltage is between 0 and Vthresh, and a second read condition exists when the detected word line voltage is greater than Vthresh.

Figure 15B:
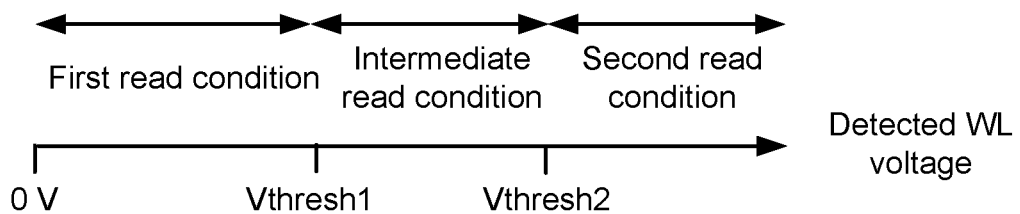
FIG. 15B shows how a first, intermediate or second read condition is a function of a detected word line voltage, in an example implementation of FIG. 13A, step 1302d.

FIG. 15B shows how a first, intermediate or second read condition is a function of a detected word line voltage, in an example implementation of FIG. 13A, step 1302d. The horizontal dimension depicts a detected word line voltage relative to thresholds Vthresh1 and Vthresh2, where Vthresh2>Vthresh1>0 V. A first read condition exists when the detected word line voltage is between 0 and Vthresh1, an intermediate read condition exists when the detected word line voltage is between Vthresh1 and Vthresh2, and a second read condition exists when the detected word line voltage is greater than Vthresh2.

Figure 16A:
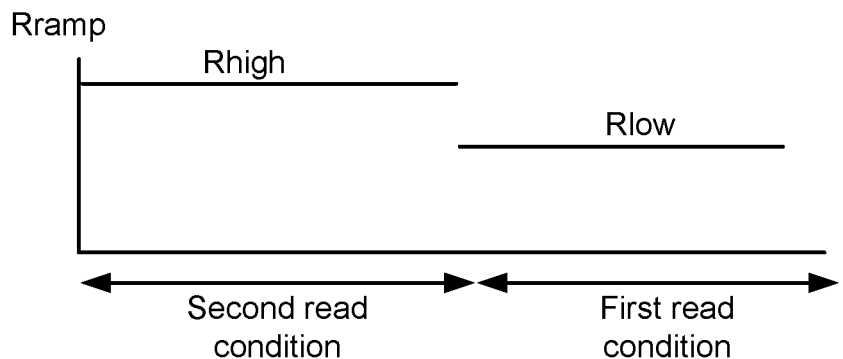

FIG. 16A shows how a ramp rate for unselected word lines, consistent with FIGS. 10H and 10I, is a function of a first or second read condition, in an example implementation of FIG. 13B, step 1313a. When the word lines are in the second or first read condition, the ramp rate (Rramp) can be set to Rhigh or Rlow, respectively, where Rlow<Rhigh.

Figure 16B:
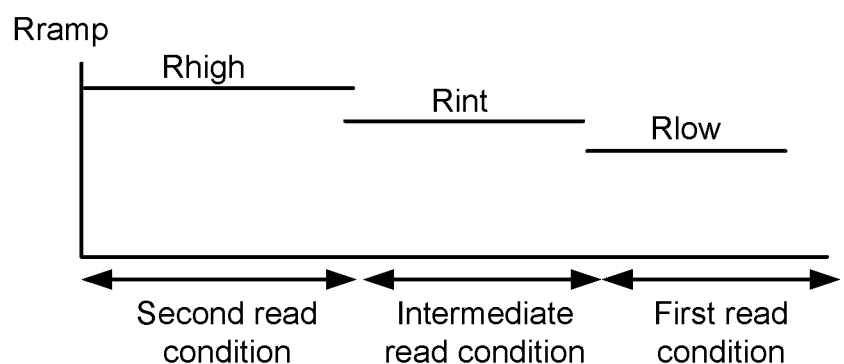

FIG. 16B shows how a ramp rate for unselected word lines, consistent with FIGS. 10H and 10I, is a function of a first, intermediate or second read condition, in an example implementation of FIG. 13B, step 1313a. When the word lines are in the second, intermediate or first read condition, the ramp rate can be set to Rhigh, Rint or Rlow, respectively, where Rlow<Rint<Rhigh.

An example implementation includes setting the rate of increase according to a voltage of the unselected word lines, wherein the rate of increase is relatively low when the voltage is relatively low. As an example, Rslow, Rint or Rfast can be used when the voltage is 0-1 V, 1-3 V or 3-5 V, respectively, in the first, intermediate or second read condition, respectively.

Figure 17A:
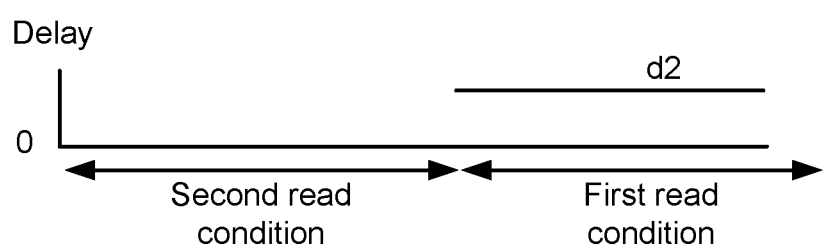
FIG. 17A shows how a delay in the increase of the voltage of unselected word lines, consistent with FIG. 10J, is a function of a first or second read condition, in an example implementation of FIG. 13B, step 1313b.

FIG. 17A shows how a delay in the increase of the voltage of unselected word lines, consistent with FIG. 10J, is a function of a first or second read condition, in an example implementation of FIG. 13B, step 1313b. When the word lines are in the second or first read condition, the delay can be set to 0 (no delay) or d2, respectively, where d2>0.

Figure 17B:
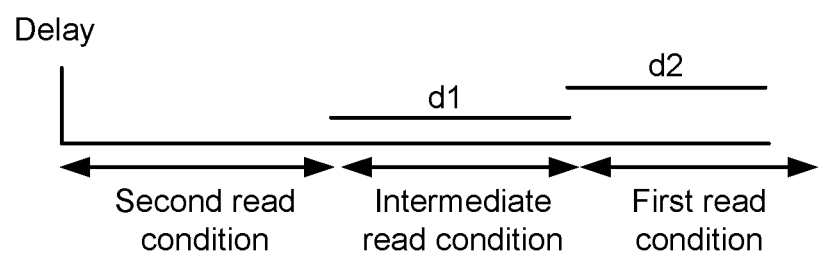
FIG. 17B shows how a delay in the increase of the voltage of unselected word lines, consistent with FIG. 10J, is a function of a first, intermediate or second read condition, in an example implementation of FIG. 13B, step 1313b.

FIG. 17B shows how a delay in the increase of the voltage of unselected word lines, consistent with FIG. 10J, is a function of a first, intermediate or second read condition, in an example implementation of FIG. 13B, step 1313b. When the word lines are in the second, intermediate or first read condition, the delay can be set to 0 (no delay), d1 or d2, respectively, where d2>d1>0.

Figure 18A:
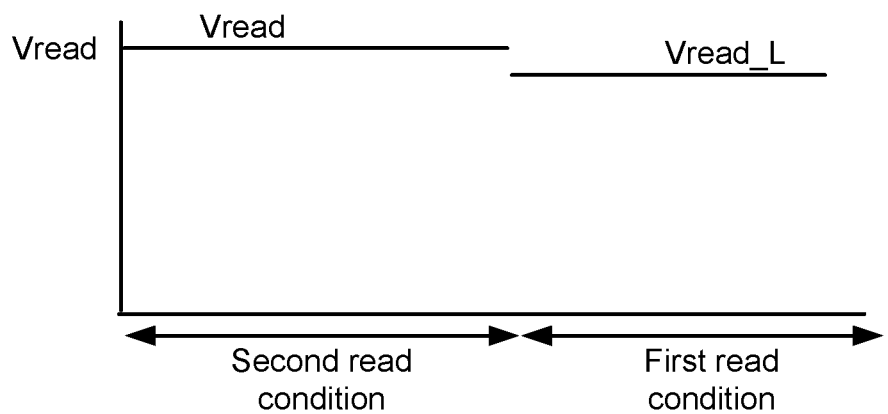
FIG. 18A shows how a magnitude of Vread for the unselected word lines, consistent with FIG. 10K, is a function of a first or second read condition, in an example implementation of FIG. 13B, step 1313c.

FIG. 18A shows how a magnitude of Vread for the unselected word lines, consistent with FIG. 10K, is a function of a first or second read condition, in an example implementation of FIG. 13B, step 1313c. When the word lines are in the second or first read condition, read pass voltage can be set to Vread (the nominal or high level) or Vread_L, respectively, where Vread>VreadL.

Figure 18B:
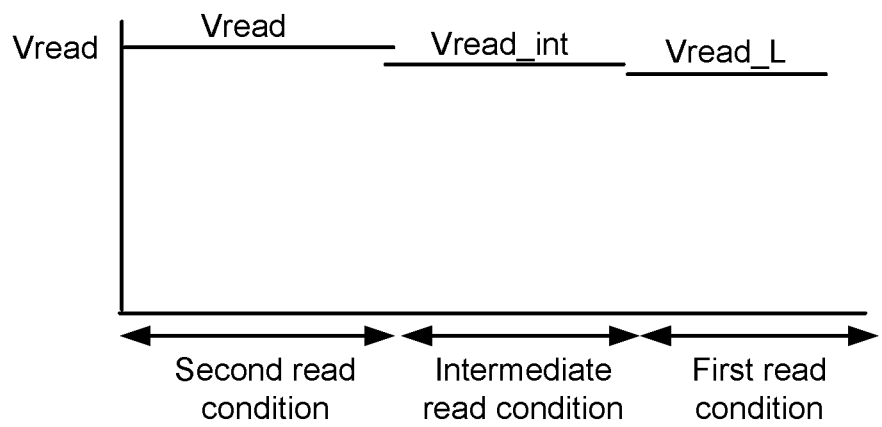
FIG. 18B shows how a magnitude of Vread for the unselected word lines, consistent with FIG. 10K, is a function of a first, intermediate or second read condition, in an example implementation of FIG. 13B, step 1313c.

FIG. 18B shows how a magnitude of Vread for the unselected word lines, consistent with FIG. 10K, is a function of a first, intermediate or second read condition, in an example implementation of FIG. 13B, step 1313c. When the word lines are in the second, intermediate or first read condition, the read pass voltage can be set to Vread, Vread_int or Vread_L, respectively, where Vread>Vread_int>VreadL.

FIG. 19A-19D show how word line voltages can be coupled up in a program or read operation to provide the word lines in a second read condition. The word line voltages subsequently decay to the first read condition. The discharge state (e.g., voltage) of the word lines at the start of a program operation is relevant to determining whether to implement a current reduction countermeasure to avoid a high current peak, as discussed.

Figures 19A, 19B:
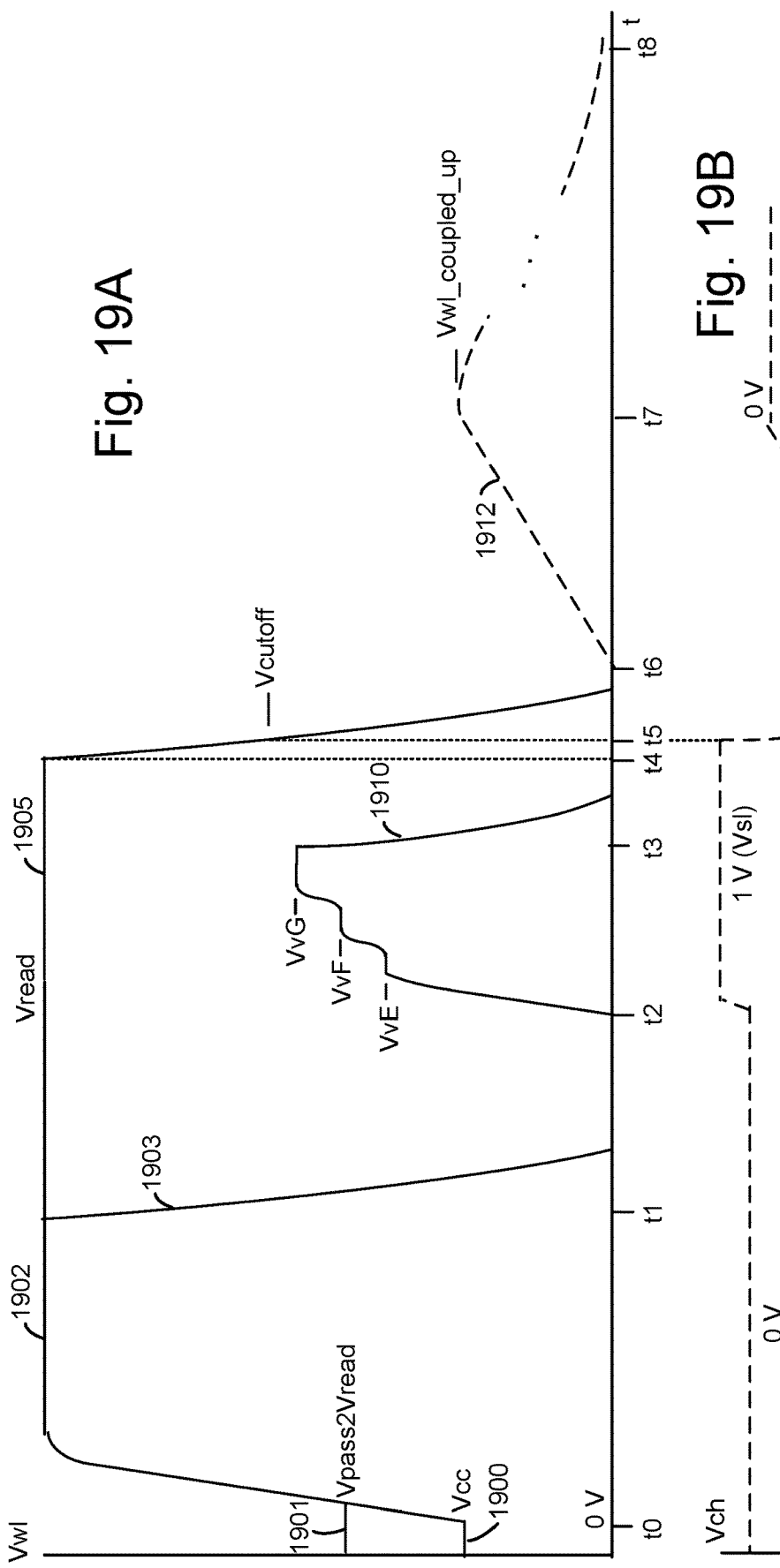
FIG. 19A depicts a plot of example voltage signals in a program loop which provide coupling up of word line voltages.
FIG. 19B depicts a plot of a channel voltage (Vch) corresponding to FIG. 19A.

FIG. 19A depicts a plot of example voltages in a program loop which provide coupling up of word line voltages. The pre-charge phase, program phase and recovery phase are omitted as a simplification. As mentioned, the control gate or word line voltage of the memory cells can be coupled up to a level such as 4-5 V after a sensing operation.

The time period shown represents a verify phase of a program-verify iteration. Typically, a program operation will include several program-verify iterations. The horizontal axis depicts time and the vertical axis depicts word line voltage, Vwl. A voltage signal of plots 1901 and 1902 represents a voltage of unselected word lines, which increases from Vpass2Vread to Vread, starting at t0. A voltage signal of plots 1900 and 1902 represents a voltage of a selected word line, which increases from Vcc to Vread, starting at t0. For the selected word line, the plot 1903 depicts the voltage decreasing from Vread to 0 V at t1.

Subsequently during the verify tests, a voltage signal of plot 1905 at Vread continues to be applied to the unselected word lines up to t4. Vread is sufficiently high to provide the associated memory cells in a conductive state so that the sensing (e.g., verify test) can occur for the memory cells of the selected word line. The voltage signal of the unselected word lines thus includes an increasing portion, a fixed amplitude portion at Vread and a decreasing portion.

A verify voltage signal 1910 is applied to the selected word line during the verify tests, starting at t2. In this example, three verify voltages, VvE-VvG, are applied, one after another. The sense circuits may be activated during each verify voltage to perform a verify test. The verify voltage signal decreases from VvG to 0 V or other steady state level at t3.

For the unselected word lines, the decrease in the voltage, starting at t4, will cause the memory cells to transition from a conductive state to a non-conductive state. In particular, when the pass voltage signal falls below a cutoff level, Vcutoff at t5, the channel of the memory cell will become cutoff, e.g., the memory cell will become non-conductive. When a cell becomes non-conductive, it acts as a capacitor in which the control gate is one plate and the channel is another plate. Vcutoff represents the voltage of the upper tail of the G state Vth distribution in this example. As the voltage decreases further, from Vcutoff to 0 V, the channel is capacitively coupled down, as represented by plot 1915 in FIG. 19B.

The voltage swing while the channel is cutoff will be larger when Vsl is larger. However, since Vch=Vsl, the minimum down coupled level of Vch will be essentially independent of Vsl. For example, a 6 V swing in the word line voltage (e.g., Vcutoff=6 V) with Vsl=1 V will result in about the same minimum down coupled level of Vch as a 5 V swing in the word line voltage (e.g., Vcutoff=5 V) with Vsl=0 V.

The plot 1912 represents the coupling up of the word line voltages from t8-t9. The coupling up is depicted as occurring relatively quickly but this is not necessarily to scale. In practice, the verify operation may consume about 100 microseconds, while the coupling up of the word line may be significantly longer, in the millisecond range such as 10 milliseconds.

FIG. 19B depicts a plot of a channel voltage (Vch) corresponding to FIG. 19A. For an unselected NAND string (a NAND string not having a memory cell which is programmed in the current program-verify iteration), Vch will be boosted to a level such as 8 V (not shown) during the program voltage. Specifically, Vch is coupled higher due to capacitive coupling from the word lines, when the voltages of the word lines are ramped up from 0 V to Vpass or Vpgm. The coupling is facilitated by allowing Vch to float, consistent with the floating body channel. Vch can float when the ends of the NAND string are cutoff, so that the channel is disconnected from the source line and bit line. The ends of the NAND string, in turn, are cutoff when the control gate voltages of the SGD and SGS transistors of the unselected NAND string are set to a low level (less than the Vth of the SGD and SGS transistors) which results in the SGD and SGS transistors being in a non-conductive state.

For a selected NAND string (a NAND string having a cell which is programmed in the current program-verify iteration), Vch is typically grounded as shown during the program voltage. Vch can be grounded by grounding the bit line, and setting a control gate voltage of the SGD transistor to a high level (above the Vth of the SGD transistor) such that the SGD transistor is in a conductive state, which allows the channel to communicate with the bit line.

During the verify voltage signal, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t5-t6 and then begins to recover to a final, steady state level of, e.g., 0 V from t6-t7. If the voltages of the word lines are allowed to float starting at t6, the voltages (plot 1912) are capacitively coupled higher by the increase in Vch. The start of the floating at t6 is a specified time after the start of the decrease in the pass voltage signal at t4. The voltages of the word lines float to a peak level of Vwl_coupled_up, e.g., about 5 V, thereby reaching the second read condition and subsequently gradually discharge to about 0 V, e.g., at t8.

For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=−4.4 V, for instance. Accordingly, there is a 4.4 V increase in Vch which is coupled to the word line, e.g., control gate, of the memory cells. Vwl_coupled_up may be about 4.4×0.9=4 V. The voltages of the word lines are floated by disconnecting the word lines from their word line driver.

FIG. 19C depicts a plot of example voltage signals in a read operation which provide coupling up of word line voltages. A read operation is similar to a verify operation since both are sensing operations and can provide a coupling up of the word line voltages. The horizontal axis depicts time and the vertical axis depicts a word line voltage, Vwl. Optionally, a Vread spike (plot 1929) is applied to the selected word line at t0-t1. A read pass voltage signal 1930 is applied to the unselected word lines from t2-t5 and has a magnitude of Vread. The read pass voltage signal includes an increasing portion, a portion at Vread and a decreasing portion. A read voltage signal for the selected word line includes a voltage signal 1922 at levels of VrC and VrG in an example of reading an upper page of data, consistent with FIG. 9A, where an eight-level memory device is used.

For the unselected word lines, the decrease in the read pass voltage signal will cause the memory cells to transition from a conductive state to a non-conductive state, as discussed. The dotted line at t6 indicates when a G state cell becomes non-conductive. As the read pass voltage signal 1930 decreases from Vcutoff to 0 V, the channel is capacitively coupled down by a similar amount, as represented by the plot 1935 in FIG. 19D. As the channel voltage increases after t7, the word line voltages are floated and are coupled higher, to Vwl_coupled_up at t8.

FIG. 19D depicts a plot of a channel voltage (Vch) corresponding to FIG. 19C. The channel is capacitively coupled down to a minimum level of Vch_min from t6-t7 and then begins to return to a final level of, e.g., 0 V from t7-t8. If the voltages of the word lines are allowed to float starting at t7, the voltages (plot 1932) are capacitively coupled higher by the increase in Vch (plot 1935). The voltages of the word lines float to a peak level of Vwl_coupled_up, as discussed and subsequently gradually discharge to about 0 V, e.g., at t9.

Figure 20:
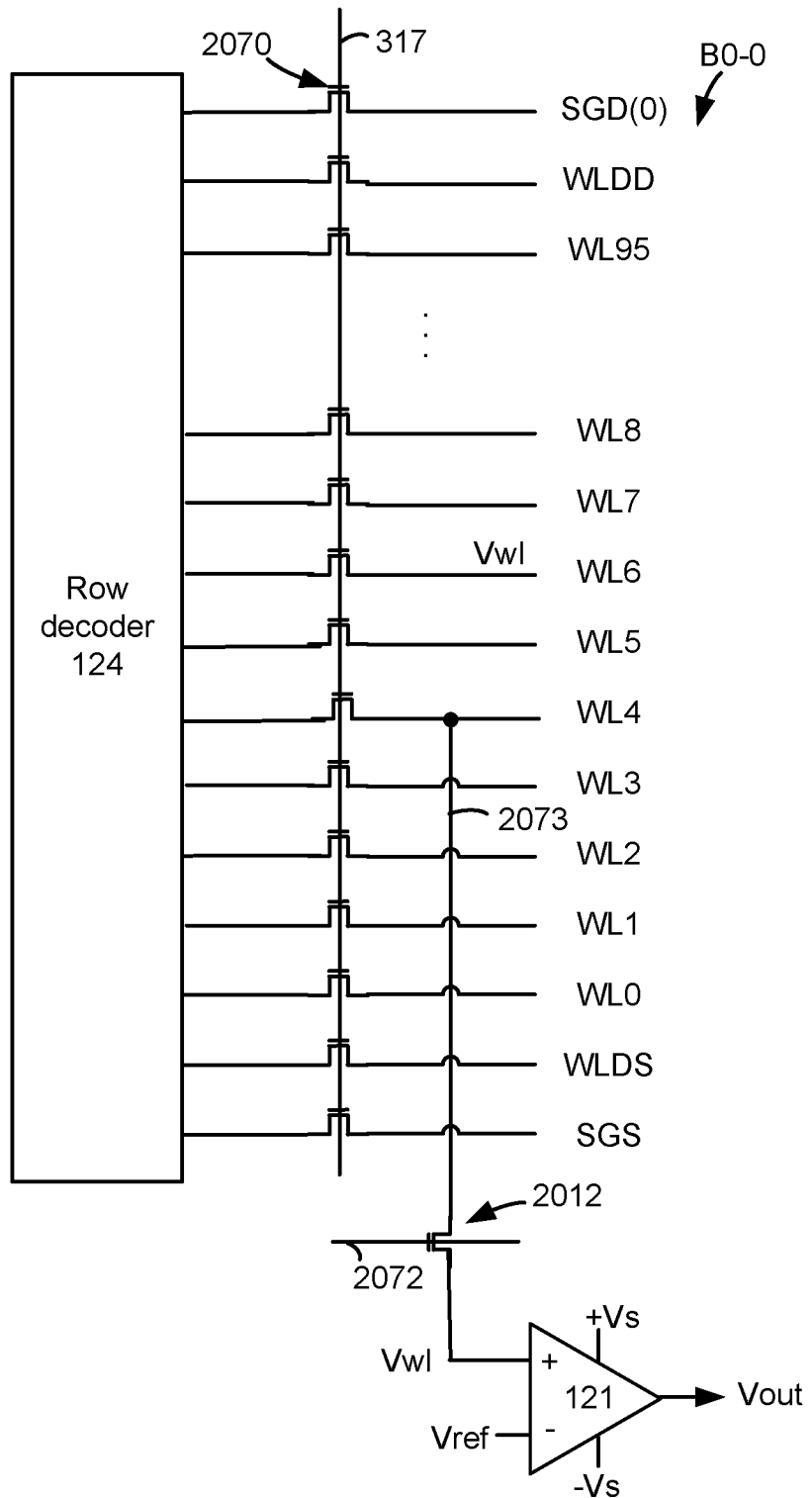
FIG. 20 depicts an example circuit for detecting a word line voltage, consistent with FIG. 13A, step 1302d.

FIG. 20 depicts an example circuit for detecting a word line voltage, consistent with FIG. 13A, step 1302d. The circuit may be used to detect a representative word line voltage to determine if a set of word lines is in a first read condition, or other condition such as an intermediate or second condition.

The word lines and select gate lines (collectively, control lines) for an example block, B0-0, are depicted. A pass gate is connected to each control line. For example, a pass gate 2070 is connected to the SGD(0) control line. The control gates of the pass gates are connected to the block enable line 317, consistent with FIG. 3A. When a voltage on the block enable line 317 is sufficiently high, the control lines are connected to the voltage drivers via the row decoder 124. When the voltage on the block enable line 317 is sufficiently low, the control lines are disconnected from the voltage drivers and floated.

In this example, a word line voltage is obtained from WL4 via a conductive path 2073 which is connected to the word line voltage detector 121 when a control signal on a line 2072 is sufficiently high to make a pass gate 2012 conductive. The word line voltage detector can comprise a comparator, for example. The comparator includes a non-inverting input which receives the word line voltage, Vwl, an inverting input which receives a reference voltage Vref, positive and negative power supplies +Vs and −Vs, respectively and an output which provides Vout. Vout=+Vs if Vwl>Vref and Vout=−Vs if Vwl<Vref. The analog output value can be provided to a controller which converts it to a 0 or 1 bit to represent Vwl>Vref or Vwl<Vref, respectively. If Vwl>Vref or Vwl<Vref, the set of word lines is considered to be in the second or first read condition, respectively.

A second comparator may be used to detect an intermediate read condition. For example, consistent with FIG. 15B, a first comparator may be used to determine if the word line voltage is greater than or less than Vthresh1, and a second comparator may be used to determine if the word line voltage is greater than or less than Vthresh2. The outputs of these two comparators therefore indicate whether the word line voltage is between 0 V and Vthresh1 (first read condition), between Vthresh1 and Vthresh2 (intermediate read condition) or greater than Vthresh2 (second read condition).

The voltage which is compared to Vref can be the full word line voltage Vwl or some fraction of the word line voltage, for example. The voltage detector may be in the peripheral area so that there is an appreciable distance between the word line and the detector, resulting in RC delays. A further issue is that the word line in the floating state may have a smaller capacitance than the conductive path 2073. These issues can be considered in the detection process. For example, a voltage of less than 2 V at the detector may correspond to a voltage of 2 V at the word line. The output of the detector can be taken at a specified time after the word line is connected to the detector via the pass gate 2012.

Generally, it is sufficient to measure the voltage of one word line in a block. It is helpful to avoid using an edge word line (e.g., WL0 or WL95) since its voltage may be impacted by edge effects. In some cases, a block may be partially programmed, but this should not affect the word line voltage reading significantly.

Accordingly, it can be see that in one implementation, an apparatus comprises: a control circuit configured to connect to a set of word lines, the set of word lines is connected to memory cells arranged in NAND strings, the set of word lines comprise a selected word line and unselected word lines; and a memory interface connected to the control circuit, the control circuit is configured to issue a command via the memory interface to perform a program operation comprising a program phase followed by a recovery phase followed by a verify phase, the control circuit is configured to make a determination of whether the set of word lines is in a first read condition at a start of the program operation; in the program phase, the control circuit is configured to apply a program voltage to the selected word line and apply a program pass voltage to the unselected word lines; in the recovery phase, the control circuit is configured to lower a voltage of the selected word line from the program voltage to a respective recovery voltage and lower a voltage of the unselected word lines from the program pass voltage to a respective recovery voltage; and in the verify phase, the control circuit is configured to apply a verify voltage to the selected word line and to determine whether to implement a current reduction countermeasure when increasing the voltage of the unselected word lines from the respective recovery voltage to a read pass voltage, based on the determination of whether the set of word lines is in the first read condition.

In another implementation, a method comprises: performing a program loop of a program operation for a selected word line in a set of word lines, the performing the program loop comprises applying a program voltage to the selected word line and a program pass voltage to unselected word lines in the set of word lines; lowering a voltage of the selected word line from the program voltage to a respective recovery voltage; lowering a voltage of the unselected word lines from the program pass voltage to a respective recovery voltage; increasing the voltage of the unselected word lines from the respective recovery voltage to a read pass voltage; and determining a rate of increase for the increasing of the voltage of the unselected word lines from among a plurality of available rates.

In another implementation, an apparatus comprises: a control circuit configured to connect to a selected word line and unselected word lines in a set of word lines, the control circuit, to perform a program operation involving the selected word line, is configured to: apply a program voltage to the selected word line and a program pass voltage to the unselected word lines; lower a voltage of the selected word line from the program voltage to a respective recovery voltage; lower a voltage of the unselected word lines from the program pass voltage to a respective recovery voltage; and start to increase a voltage of one group of the unselected word lines from the respective recovery voltage to a read pass voltage, wait until a delay period has passed, then start to increase a voltage of another group of the unselected word lines from the respective recovery voltage to the read pass voltage.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of word lines, the set of word lines is connected to memory cells arranged in NAND strings, the set of word lines comprise a selected word line and unselected word lines; and
a memory interface connected to the control circuit, the control circuit is configured to issue a command via the memory interface to perform a program operation comprising a program phase followed by a recovery phase followed by a verify phase, the control circuit is configured to make a determination of whether the set of word lines is in a first read condition at a start of the program operation;
in the program phase, the control circuit is configured to apply a program voltage to the selected word line and apply a program pass voltage to the unselected word lines;
in the recovery phase, the control circuit is configured to lower a voltage of the selected word line from the program voltage to a respective recovery voltage and lower a voltage of the unselected word lines from the program pass voltage to a respective recovery voltage; and in the verify phase, the control circuit is configured to apply a verify voltage to the selected word line and to determine whether to implement a current reduction countermeasure when increasing the voltage of the unselected word lines from the respective recovery voltage to a read pass voltage, based on the determination of whether the set of word lines is in the first read condition.

2. The apparatus of claim 1, wherein:
the control circuit is configured to implement the current reduction countermeasure in response to a determination that the set of word lines is in the first read condition and a determination that the verify phase is in a first program-verify iteration of a plurality of program-verify iterations of the program operation.

3. The apparatus of claim 1, wherein:
the control circuit is configured to determine whether the set of word lines is in a second read condition at the start of the program operation;
to implement the current reduction countermeasure when the set of word lines is in the first read condition, the control circuit is configured to set a first rate for the increase of the voltage of the unselected word lines from the respective recovery voltage to the read pass voltage; and
when the set of word lines is in the second read condition, the control circuit is configured to set a second rate, which is greater than the first rate, for the increase of the voltage of the unselected word lines from the respective recovery voltage to the read pass voltage.

4. The apparatus of claim 3, wherein:
the control circuit is configured to determine whether the set of word lines is in an intermediate read condition, between the first read condition and a second read condition, at the start of the program operation; and
when the set of word lines is in the intermediate read condition, the control circuit is configured to set an intermediate rate, which is greater than the first rate and less than the second rate, for the increase of the voltage of the unselected word lines from the respective recovery voltage to the read pass voltage.

5. The apparatus of claim 1, wherein:
to implement the current reduction countermeasure when the set of word lines is in the first read condition, the control circuit is configured to start to increase a voltage of one group of the unselected word lines from the respective recovery voltage to the read pass voltage, wait until a delay period has passed, then start to increase a voltage of another group of the unselected word lines from the respective recovery voltage to the read pass voltage.

6. The apparatus of claim 5, wherein:
the one group of the unselected word lines comprises unprogrammed word lines; and
the another group of the unselected word lines comprises programmed word lines.

7. The apparatus of claim 5, wherein:
the control circuit is configured to determine whether the set of word lines is in a second read condition at the start of the program operation; and
when the set of word lines is in the second read condition, the control circuit is configured to concurrently start to increase the voltage of each of the unselected word lines from the respective recovery voltage to the read pass voltage.

8. The apparatus of claim 1, wherein:
the control circuit is configured to determine whether the set of word lines is in a second read condition at the start of the program operation;
to implement the current reduction countermeasure when the set of word lines is in the first read condition, the control circuit is configured to set a first level for the read pass voltage; and
when the set of word lines is in the second read condition, the control circuit is configured to set a second level, which is greater than the first level, for the read pass voltage.

9. The apparatus of claim 1, wherein:
the control circuit, to make the determination that the set of word lines is in the first read condition, is configured to determine that an elapsed time since a last sensing operation involving the set of word lines exceeds a threshold.

10. The apparatus of claim 1, wherein:
the control circuit, to make the determination that the set of word lines is in the first read condition, is configured to detect a power on event.

11. The apparatus of claim 1, wherein:
the control circuit, to make the determination that the set of word lines is in the first read condition, is configured to determine that a discharge voltage has been applied to the set of word lines during an operation involving another set of word lines.

12. A method, comprising:
performing a program loop of a program operation for a selected word line in a set of word lines, the performing the program loop comprises applying a program voltage to the selected word line and a program pass voltage to unselected word lines in the set of word lines;
lowering a voltage of the selected word line from the program voltage to a respective recovery voltage;
lowering a voltage of the unselected word lines from the program pass voltage to a respective recovery voltage;
increasing the voltage of the unselected word lines from the respective recovery voltage to a read pass voltage; and
determining a rate of increase for the increasing of the voltage of the unselected word lines from among a plurality of available rates.

13. The method of claim 12, further comprising:
setting the rate of increase to a first rate when the set of word lines is in a first read condition and when the program loop is a first program loop of the program operation; and
setting the rate of increase to a second rate, which is greater than the first rate, when the set of word lines is in a second read condition and when the program loop is the first program loop of the program operation.

14. The method of claim 12, further comprising:
setting the rate of increase to a first rate when the set of word lines is in a first read condition and when the program loop is a first program loop of the program operation; and
setting the rate of increase to a second rate, which is greater than the first rate, when the program loop is not a first program loop of the program operation.

15. The method of claim 12, further comprising:
setting the rate of increase according to a voltage of the unselected word lines, wherein the rate of increase is relatively low when the voltage is relatively low.

16. An apparatus, comprising:
a control circuit configured to connect to a selected word line and unselected word lines in a set of word lines, the control circuit, to perform a program operation involving the selected word line, is configured to:
- apply a program voltage to the selected word line and a program pass voltage to the unselected word lines;
- lower a voltage of the selected word line from the program voltage to a respective recovery voltage;
- lower a voltage of the unselected word lines from the program pass voltage to a respective recovery voltage; and
- start to increase a voltage of one group of the unselected word lines from the respective recovery voltage to a read pass voltage, wait until a delay period has passed, then start to increase a voltage of another group of the unselected word lines from the respective recovery voltage to the read pass voltage.

17. The apparatus of claim 16, wherein:
the control circuit is configured to set a magnitude of the delay period based on a voltage of the set of word lines at a start of the program operation.

18. The apparatus of claim 16, wherein:
the control circuit is configured to implement the delay period in response to a determination that the set of word lines is in a first read condition.

19. The apparatus of claim 16, wherein:
the one group of the unselected word lines is after the selected word line in a word line program order; and
the another group of the unselected word lines is before the selected word line in the word line program order.

20. The apparatus of claim 16, wherein:
the set of word lines are connected to memory cells in NAND strings;
each NAND string comprises a drain end select gate transistor; and
a start of the increase of the voltage of one group of the unselected word lines occurs before a start of an increase of a voltage signal applied to the drain end select gate transistors.

* * * * *